United States Patent
May et al.

(10) Patent No.: US 11,532,584 B2
(45) Date of Patent: Dec. 20, 2022

(54) PACKAGE SUBSTRATE WITH HIGH-DENSITY INTERCONNECT LAYER HAVING PILLAR AND VIA CONNECTIONS FOR FAN OUT SCALING

(71) Applicant: Intel Corporation, Santa Clara, CA (US)

(72) Inventors: Robert Alan May, Chandler, AZ (US); Sri Ranga Sai Boyapati, Chandler, AZ (US); Kristof Kuwawi Darmawikarta, Chandler, AZ (US); Srinivas V. Pietambaram, Chandler, AZ (US); Javier Soto Gonzalez, Chandler, AZ (US); Kwangmo Chris Lim, Seoul (KR); Aleksandar Aleksov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 115 days.

(21) Appl. No.: 17/098,754

(22) Filed: Nov. 16, 2020

(65) Prior Publication Data
US 2021/0066232 A1     Mar. 4, 2021

Related U.S. Application Data

(63) Continuation of application No. 16/347,188, filed as application No. PCT/US2016/069377 on Dec. 30, 2016, now Pat. No. 10,872,872.

(51) Int. Cl.
*H01L 23/00* (2006.01)
*H01L 23/498* (2006.01)
(Continued)

(52) U.S. Cl.
CPC .......... *H01L 24/24* (2013.01); *H01L 21/4857* (2013.01); *H01L 23/13* (2013.01);
(Continued)

(58) Field of Classification Search
None
See application file for complete search history.

(56) References Cited

U.S. PATENT DOCUMENTS 10,872,872 B2 *  12/2020  May .................. H01L 23/49816
2007/0289127 A1  12/2007  Hurwitz et al.
(Continued)

FOREIGN PATENT DOCUMENTS

KR     20160026653 A *  9/2016
WO       2018125184 A1   7/2018

OTHER PUBLICATIONS

Final Office Action in U.S. Appl. No. 16/347,188 dated Jul. 1, 2020, 9 pages.
(Continued)

*Primary Examiner* — Telly D Green
(74) *Attorney, Agent, or Firm* — Akona IP PC

(57) ABSTRACT

Integrated circuit package substrates with high-density interconnect architecture for scaling high-density routing, as well as related structures, devices, and methods, are generally presented. More specifically, integrated circuit package substrates with fan out routing based on a high-density interconnect layer that may include pillars and vias, and integrated cavities for die attachment are presented. Additionally, integrated circuit package substrates with self-aligned pillars and vias formed on the high-density interconnect layer as well as related methods are presented.

18 Claims, 19 Drawing Sheets

(51) Int. Cl.
*H01L 23/522* (2006.01)
*H01L 23/13* (2006.01)
*H01L 21/48* (2006.01)
*H01L 25/065* (2006.01)

(52) U.S. Cl.
CPC .. *H01L 23/49816* (2013.01); *H01L 23/49822* (2013.01); *H01L 23/522* (2013.01); *H01L 23/5226* (2013.01); *H01L 25/0652* (2013.01); *H01L 2224/24226* (2013.01)

(56) References Cited

U.S. PATENT DOCUMENTS

| | | |
|---|---|---|
| 2011/0316140 A1 | 12/2011 | Nalla et al. |
| 2012/0038053 A1 | 2/2012 | Oh et al. |
| 2013/0292804 A1 | 11/2013 | Lee et al. |
| 2015/0348931 A1 | 12/2015 | Lee et al. |
| 2016/0079171 A1 | 3/2016 | Yeh et al. |
| 2016/0126173 A1 | 5/2016 | Kim et al. |
| 2016/0126174 A1 | 5/2016 | Shen et al. |

OTHER PUBLICATIONS

International Search Report and Written Opinion issued in PCT Application No. PCT/US2016/069377 dated Sep. 27, 2017; 9 pages.
Non Final Office Action in U.S. Appl. No. 16/347,188 dated Mar. 13, 2020, 8 pages.
Notice of Allowance in U.S. Appl. No. 16/347,188 dated Sep. 3, 2020, 12 pages.

* cited by examiner

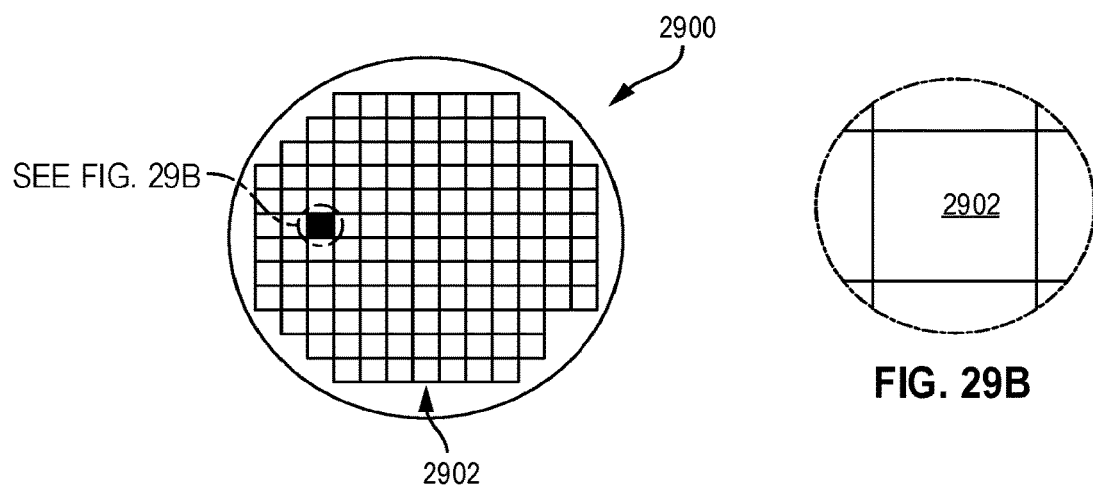
FIG. 29A
FIG. 29B
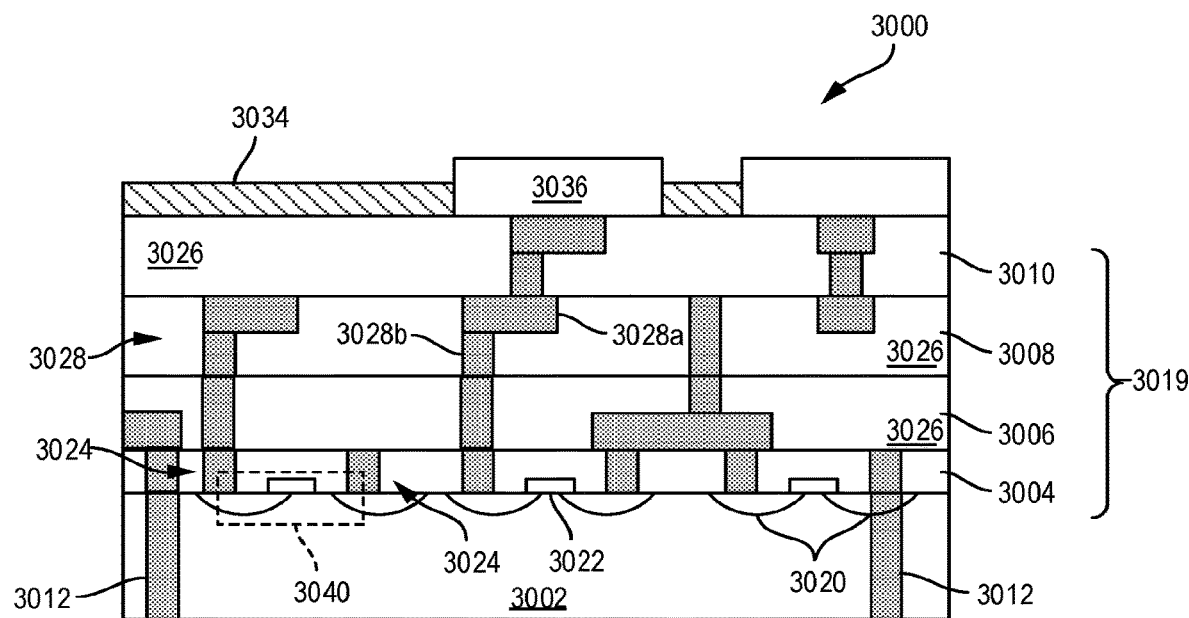
FIG. 30

PACKAGE SUBSTRATE WITH HIGH-DENSITY INTERCONNECT LAYER HAVING PILLAR AND VIA CONNECTIONS FOR FAN OUT SCALING

CROSS-REFERENCE TO RELATED APPLICATION

This application is a continuation of U.S. patent application Ser. No. 16/347,188 filed May 2, 2019 and entitled "WITH HIGH-DENSITY INTERCONNECT LAYER HAVING PILLAR AND VIA CONNECTIONS FOR FAN OUT SCALING," which is a national stage application under 35 U.S.C. § 371 of PCT International Application Serial No. PCT/US2016/069377 filed on Dec. 30, 2016 and entitled "PACKAGE SUBSTRATE WITH HIGH-DENSITY INTERCONNECT LAYER HAVING PILLAR AND VIA CONNECTIONS FOR FAN OUT SCALING," all of which are hereby incorporated by reference in their entirety.

FIELD

Embodiments relate to manufacturing of semiconductor devices. More particularly, the embodiments relate to a package substrate having a high-density interconnect layer with pillars and vias for scaling of interconnects as well as integrated cavities for die attachment.

BACKGROUND

Semiconductor dies are routinely connected to larger circuit boards such as motherboards and other types of printed circuit boards (PCBs) via a package substrate. A package substrate typically has two sets of connection points, a first set for connection to the die or multiple dies and a second less densely-packed set for connection to the PCB. A package substrate generally consists of an alternating sequence of a plurality of organic insulation or dielectric layers and a plurality of patterned electrically conductive layers forming traces between the insulation layers. Electrically conductive vias, which extend through the insulation layers, electrically interconnect the conductive layers. Continued advancements in integrated circuit technology have resulted in the need for package substrates having higher routing density.

BRIEF DESCRIPTION OF THE DRAWINGS

Embodiments described herein illustrated by way of example and not limitation in the figures of the accompanying drawings, in which like references indicate similar features. The following figures are illustrative, and other processing techniques or stages can be used in accordance with the subject matter described herein. Furthermore, some conventional details have been omitted so as not to obscure from the inventive concepts described herein.

FIGS. 29A and 29B are top views of a wafer and dies that may be used with any of the embodiments of the IC structures disclosed herein.

FIG. 30 is a cross-sectional side view of an IC device that may be used with any of the embodiments of the IC structures disclosed herein.

DETAILED DESCRIPTION

Figure 1:
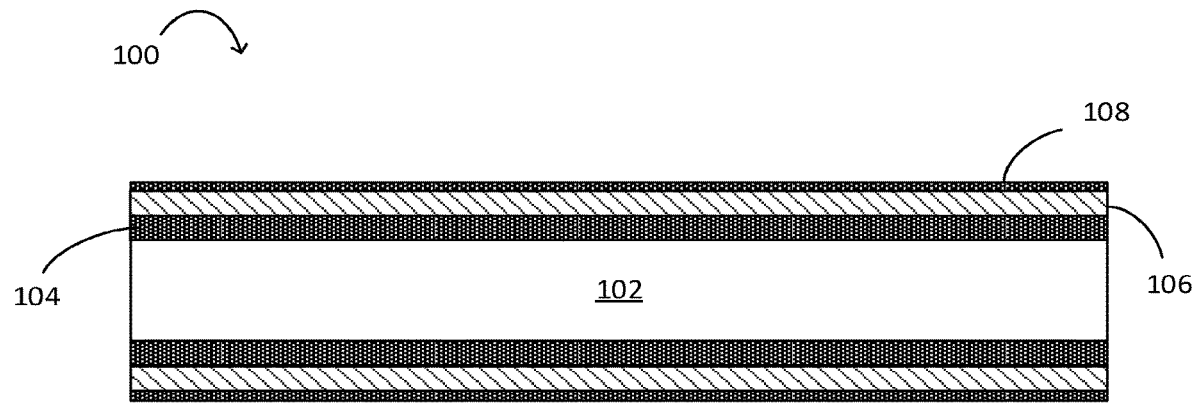
FIGS. 1-12 are cross-sectional side views of various stages in the manufacture of a package substrate having a high-density interconnect layer for scaling interconnects, in accordance with various embodiments.

Integrated circuit package substrates with high-density interconnect architecture for scaling routing, as well as related structures, devices, and methods, are generally presented. More specifically, integrated circuit package substrates with fan out routing based on a high-density interconnect layer that include pillars and vias, and integrated cavities for die attachment are presented. Additionally, integrated circuit package substrates with self-aligned pillars and vias as well as related methods are presented.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," "on," and the like in the description and in the claims, if any, are used for descriptive purposes and not necessarily for describing permanent relative positions.

Package substrates for multi-chip packaging (MCP) require significantly high-density input/output (IO) routing as well as varied IO density for die attachment. The IO density of a substrate may be physically constrained by other elements within the substrate, including via size, line/space pitch (L/S), bump pitch, via-to-pad alignment, pad-to-via alignment, and material (e.g. resist and thin dielectric material) properties. For example, using a known process to achieve a 110 micron (um) bump pitch results in a density of less than 20 IO/mm/layer where vias have a diameter of 50 um, a 10/10 um L/S, and 15 um alignment. As used herein, bump pitch refers to the distance between bumps (i.e., center point to center point). As used herein, "line space" and "L/S" are used interchangeably and refer to the width of the conductive trace followed by the space from the edge of one conductive trace to the edge of the next conductive trace. As used herein, "line space pitch" refers to the summation of the line and space values.

As described herein, very high-density interconnects or routing may be a single layer or multiple layers where the conductive traces in multiple layers are connected by vias, and refers to an input and output (IO) density associated with a substrate layer, where the IO density is greater than 100 IO density (i.e., 100 IO/mm/layer). As used herein, "high-density layer", "high-density interconnects", and "high-density interconnect layer" may be used interchangeably. High-density interconnect layers may enable communication between dies on the same integrated circuit package by conductively connecting or coupling the dies.

As is known in the art, the term "interconnect" (also sometimes referred to as a trench, a line, or a trace) is used to describe an electrically conductive line isolated by a layer typically comprising an interlayer dielectric material that is provided within the plane of an IC chip. Such interconnects are typically stacked into several levels with a layer of dielectric in between the metal layers to form a package substrate, an interposer, or other integrated circuit interconnect structures. This stack of dielectric and conductive layers may be referred to herein as the "package substrate", "build up layer", or "package substrate build up layer", and may be formed using build up processes that are known in the art. As is also known in the art, the term "via" is used to describe an electrically conductive element that electrically interconnects two or more metal trenches of different levels. Vias are provided substantially perpendicularly to the plane of an IC chip. A via may interconnect two metal trenches in adjacent levels or two metal trenches in levels that are not adjacent to one another. As is known in the art, the terms lines, trenches, and vias are commonly associated with the features that are used to form metal interconnects. As used herein, the terms "line", "trace", "interconnect", and "trench" may be used interchangeably.

A high-density interconnect layer (e.g., 2/2 micron L/S) may be used to fan out routing for bump pitch (BP) dimensions that are too dense for current standard substrate technology (for example, a 40 um BP may be fanned out to a 100 um BP). The high-density layer may be used with via and pillar formation to enable high routing density (e.g., 2/2 um L/S and 14 um Pad) on a single layer. As used herein, pillar refers to a conductive vertical structure formed on the active side of the high-density interconnect layer that connects the high-density layer to a die or other device. As used herein, via refers to a conductive vertical structure formed on the back side of the high-density interconnect layer that connects the high-density layer to the package substrate. Also, as used herein, via may refer to a via formed in the package substrate, however, the following description as well as context will distinguish a via formed on a high-density interconnect layer from a via formed in the package substrate layer, as necessary. The high-density interconnect layer may be used as the starting layer for the fan out routing, which may be performed in multiple layers of a package substrate in accordance with standard design rules (e.g. 10/10 um L/S and 80 um pad). In some embodiments, the fan out routing may include an integrated cavity for the attachment of die with a coarser bump pitch to reduce both substrate x/y dimensions and warpage risks. In some embodiments, an embedded trace (ETS) layer is an example of a package substrate described herein having a high-density interconnect layer with via and pillar formation as the starting layer for the fan out routing. In some embodiments, the I/O range of the high-density interconnect layer is between 100-1000 I/O/mm/layer. In some embodiments, the pad size of the high-density interconnect layer may be 1 um-24 um. In some embodiments, the bump pitch of the high-density interconnect layer may be 10 um-80 um.

FIGS. 1-12 are cross-sectional side views of various stages in the manufacture of a package substrate of that includes a high-density interconnect layer for scaling interconnects, in accordance with various embodiments. FIGS. 1-12 illustrate substrates being formed on both sides of the carrier, as such, all descriptions apply to both sides of the carrier.

FIG. 1 illustrates assembly 100 including a carrier or carrier substrate 102, a first metal layer 104, a second metal layer 106, and a seed layer 108. Carrier 102 maybe rigid to provide a flat and stable surface to facilitate tight design rules (e.g., 4 um pitch copper patterns, etc.) during manufacturing. Carrier 102 may be of any suitable material, such as stainless steel, glass, silicon, fiber-glass reinforced epoxy, among others. Carrier 102 may be temporary and may include a release layer onto which the first metal layer 104 may be deposited. The first metal layer 104 may be a foil layer and may be any suitable metal, preferably, copper. The first metal layer 104 may be laminated on the surfaces of the carrier 102, plated, or otherwise deposited using any suitable means. In certain examples, the surfaces of the carrier 102 may include the first metal layer 104, such that the carrier may be referred to as a nickel-clad carrier when the first metal layer 104 is nickel, or may be referred to as a copper-clad carrier when the first metal layer 104 is copper, etc. The second metal layer 106 may be plated or laminated onto the first metal layer 104, and may be any suitable metal that is different from the first metal layer, preferably, nickel. Nickel and copper are advantageous first and second metals because they are easily deposited, and each have selective etches to remove one metal while leaving the other. In other examples, the first and second metals may be switched, or other metals may be used in accordance with these principles. The second metal layer may be plated or laminated on top of the first metal layer to facilitate self-aligned pillar formation as described below with reference to FIGS. 22-28. In some embodiments, the second metal layer thickness may be between 3 um and 20 um. The seed layer 108 may be deposited on the second metal layer 106 and may be any suitable material, preferably, copper. In some embodiments, the seed layer 108 maybe plated using an electroless process. In some embodiments, the seed layer thickness may be less than 1 um.

Figure 2:
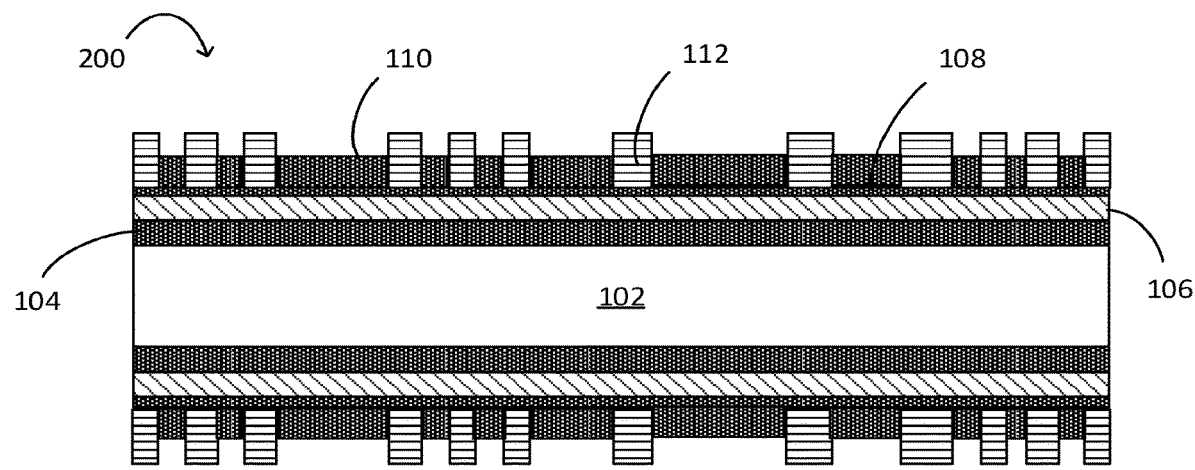

FIG. 2 illustrates assembly 200 subsequent to applying a photoresist 112 to assembly 100 and lithographically patterning the high-density layer 110. Before patterning, the carrier may be planarized by grinding, lapping or chemical mechanical polishing to reduce surface roughness and comply with flatness requirements for photolithography. Photoresist 112 may be a liquid or dry film type. The photoresist 112 may be applied to the carrier 102 and the high-density layer may be lithographically patterned. After patterning, metal traces may be plated in regions where the photoresist was removed. The metal traces 110 maybe any suitable metal, preferably, copper.

Figure 3:
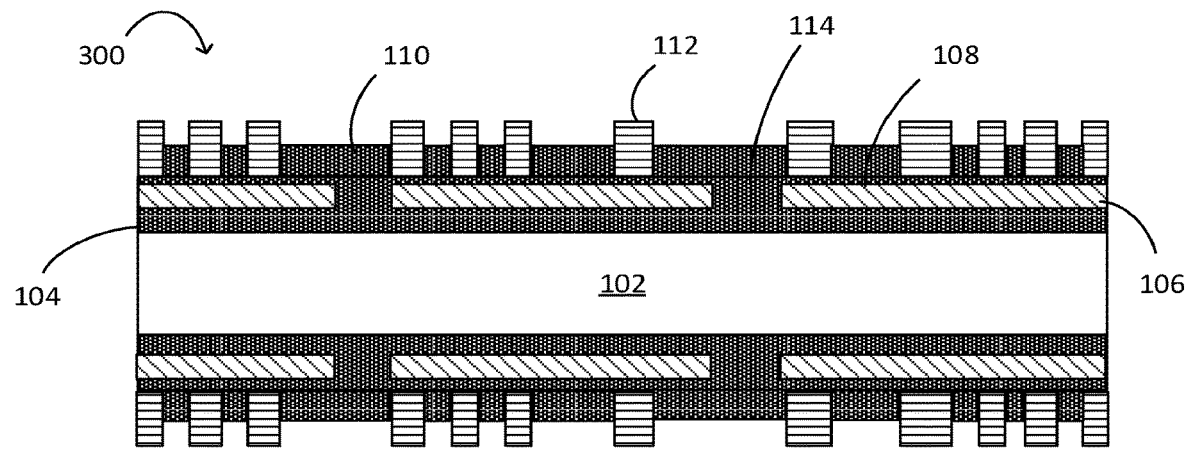

FIG. 3 illustrates assembly 300 subsequent to pillar formation 114 on the high-density layer in assembly 200. In some embodiments, pillars may be formed by chemically etching using a dry or wet etching process, or any other suitable process. In some embodiments, the pillars are formed using self-aligned pillar formation. As used herein, a self-aligned pillar refers to a conductive vertical structure that is formed by a self-aligned pillar formation process described below that connects the high-density layer to a die or other device. The pillar is formed on the "active side" of the high-density interconnect layer, which becomes the active side of the package substrate.

Figure 4:
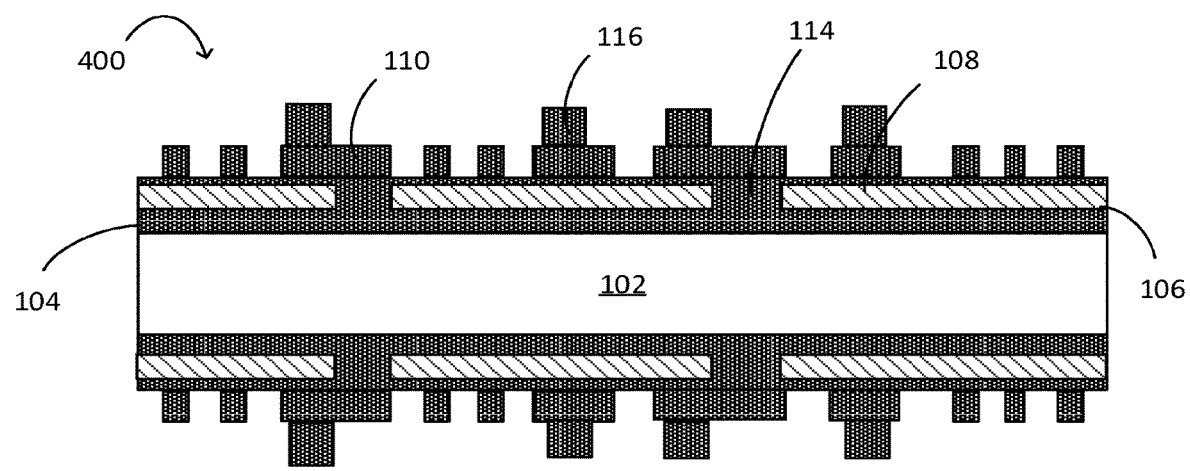

FIG. 4 illustrates an assembly 400 subsequent to via formation 116 on the high-density layer in assembly 300. In some embodiments, the vias are formed using self-aligned via formation. As used herein, a self-aligned via refers to a conductive vertical structure that is formed using a self-aligned via formation process described below and connects the high-density layer to the package substrate. The via is formed on the "back side" of the high-density interconnect layer, which becomes the back side of the package substrate. For example, a semi additive process (SAP) process, a subtractive process, or other known process, may be used to form the package substrate layer. As described below with reference to FIGS. 22-28, for self-aligned via and pillar formation, the photoresist remains on the surface as part of the self-alignment process as the first photoresist layer. Once the self-aligned pillars 114 and vias 116 are formed, photoresist 112 may be removed.

The conductive vias and pillars may be formed of one or more conductive materials, such as a metal (e.g., copper). Although the conductive vias and pillars are shown in the figures as having substantially parallel sidewalls, they may have any profile (e.g., as dictated by the manufacturing operations used to form them). For example, in some embodiments, the conductive vias and pillars may be tapered towards the front side or the back side. In some embodiments, the width (e.g., the diameter) may differ along the length of the conductive pathway, where one portion may be wider (e.g., have a larger diameter) than another portion. Although the vias and pillars may be any suitable size, in some embodiments, the self-aligned vias may have a diameter of approximately 2 um-10 um, and the self-aligned pillars may have a diameter of approximately 2-20 um and a bump pitch of 10 um-80 um.

Figure 5:
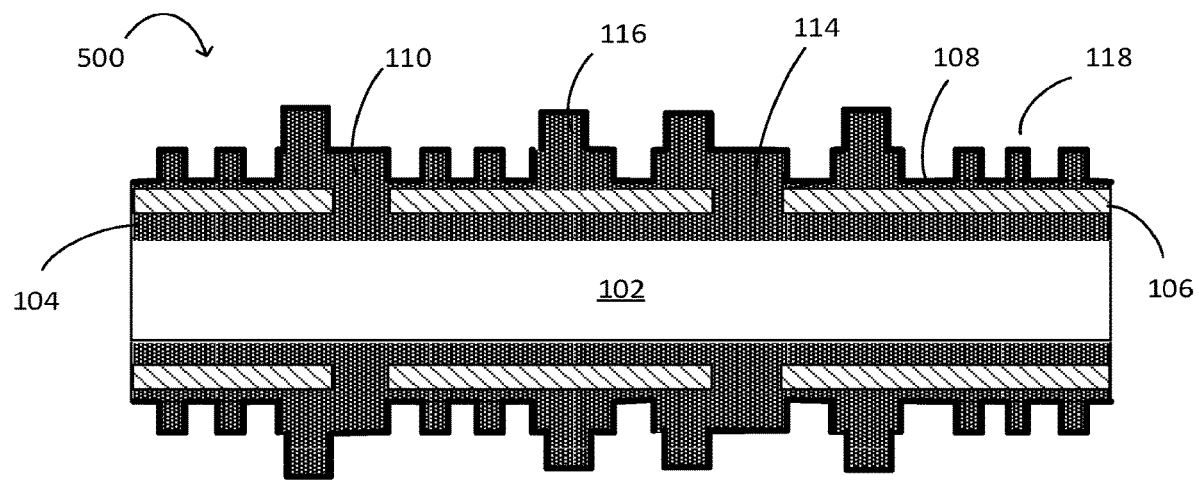

FIG. 5 illustrates assembly 500 subsequent to removing the photoresist 112 and, optionally, treating the exposed copper with an adhesion promoter 118. The adhesion promoter 118 may be a roughening type, a chemical type or a dry type, for example, silicon nitride deposited by plasma-enhanced chemical vapor deposition (PECVD). An adhesion promoter may be disposed between any dielectric material and any conductive material to promote adhesion between the materials.

Figure 6:
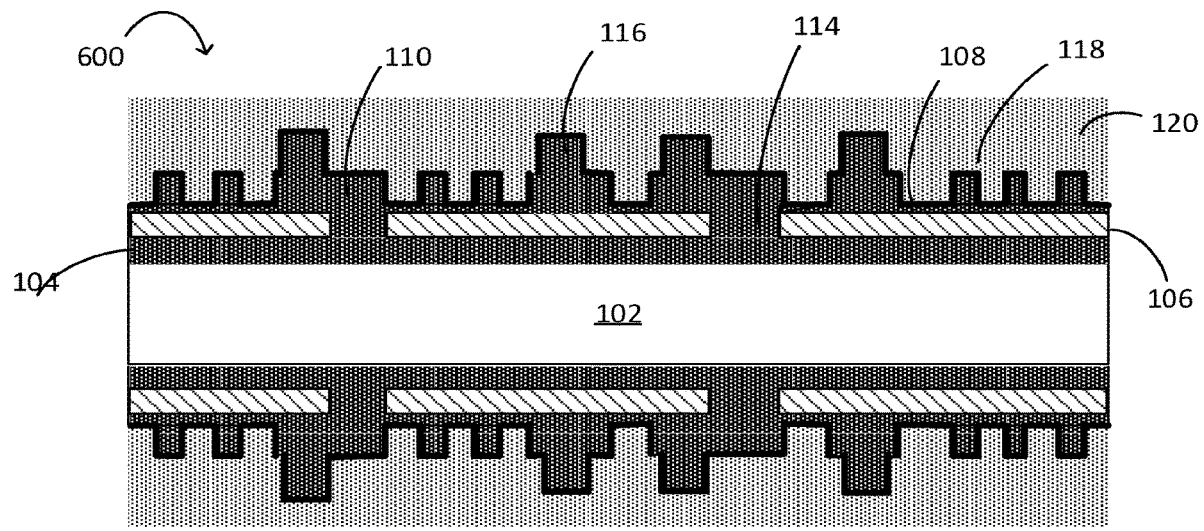

FIG. 6 illustrates assembly 600 subsequent to laminating dielectric 120 on the high-density/via layer in assembly 500. Dielectric layers may be formed using any suitable process, such as lamination or slit coating and curing, and with any suitable material. Examples of dielectric materials that may be used include, but are not limited to, epoxy-based materials/films, ceramic/silica filled epoxide films, polyimide films, filled polyimide films, other organic materials, and other inorganic dielectric materials known from semiconductor processing as well as silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass (OSG). In some embodiments, dielectric layers may be formed to a thickness that will completely cover a top surface of the one or more vias to account for uneven surfaces. In some embodiments, the thickness of dielectric layers may be minimized to reduce the etching time required to expose the one or more vias in a subsequent processing operation. In some embodiments, dielectric layer thickness may be 3 um-30 um.

Figure 7:
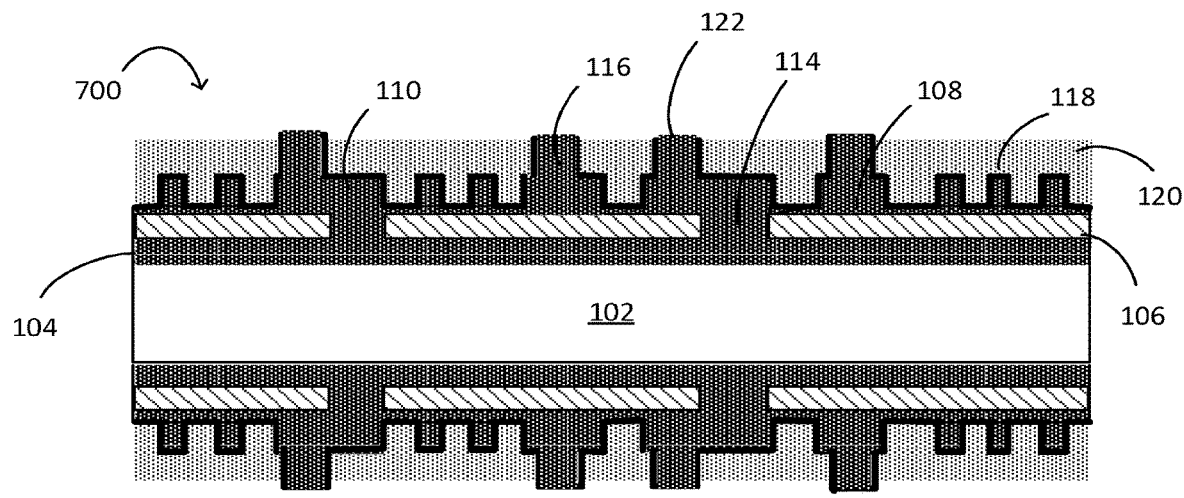

FIG. 7 illustrates assembly 700 subsequent to revealing the top surface of the vias 122 in assembly 600. The top surface of the vias 122 may be revealed by planarization, for example, grinding, lapping or chemical mechanical polishing (CMP), or by etching, including wet or dry etching.

Figure 8:
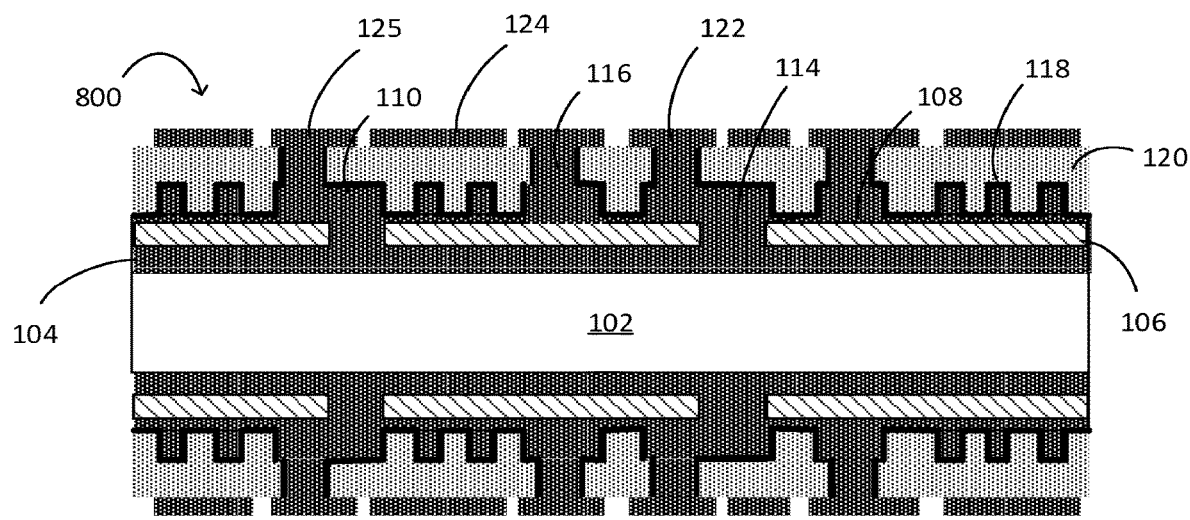

FIG. 8 illustrates assembly 800 subsequent to beginning the package substrate build up process (e.g., SAP) by depositing patterned metal layer 124 on assembly 700. As illustrated, conductive material is deposited into openings formed by the patterned photoresist layer to form traces 124, and pads 125.

Figure 9:
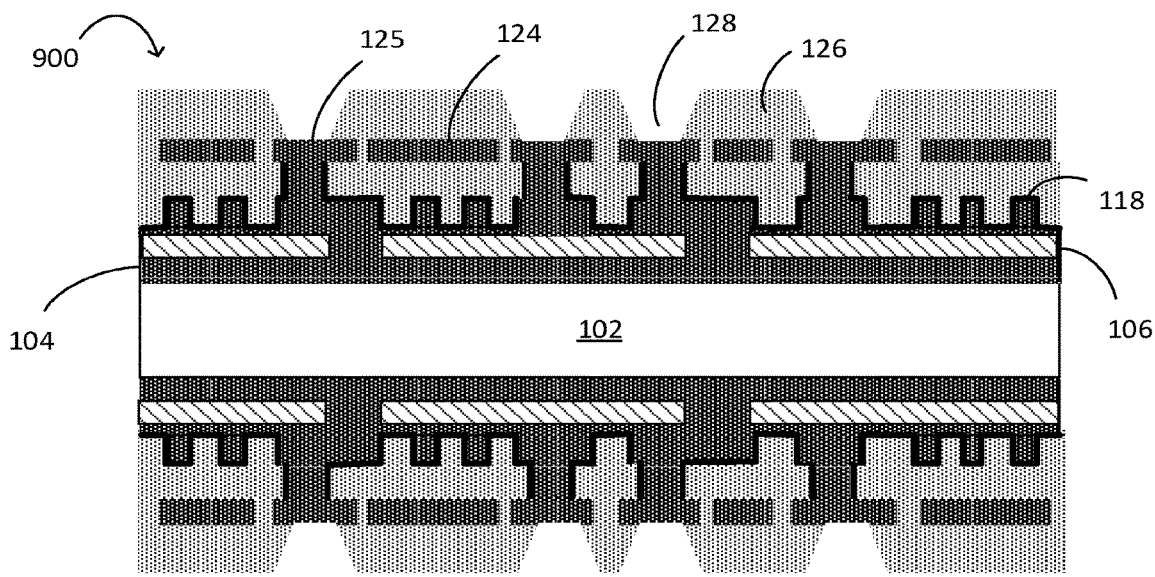

FIG. 9 illustrates assembly 900 subsequent to laminating dielectric layer 126 and drilling via openings 128. The metal layer 124 may be any type of conductive metal, preferably, copper, and may be deposited using any suitable process, such as electrolytic plating. In some embodiments, the metal layer 124 may have a thickness of 10 um-20 um. Conductive structures may be formed using any suitable method, including lithography and electrolytic plating, and may include one or more layers. Conductive vias 128, lines 124, and pads 125 may be formed from any suitable conductive material, for example, copper, aluminum (Al), gold (Au), silver (Ag) and or alloys thereof. In some embodiments of the invention, the metal used for interconnects is copper or an alloy of copper. Preferably, conductive interconnects are copper (Cu).

Figure 10:
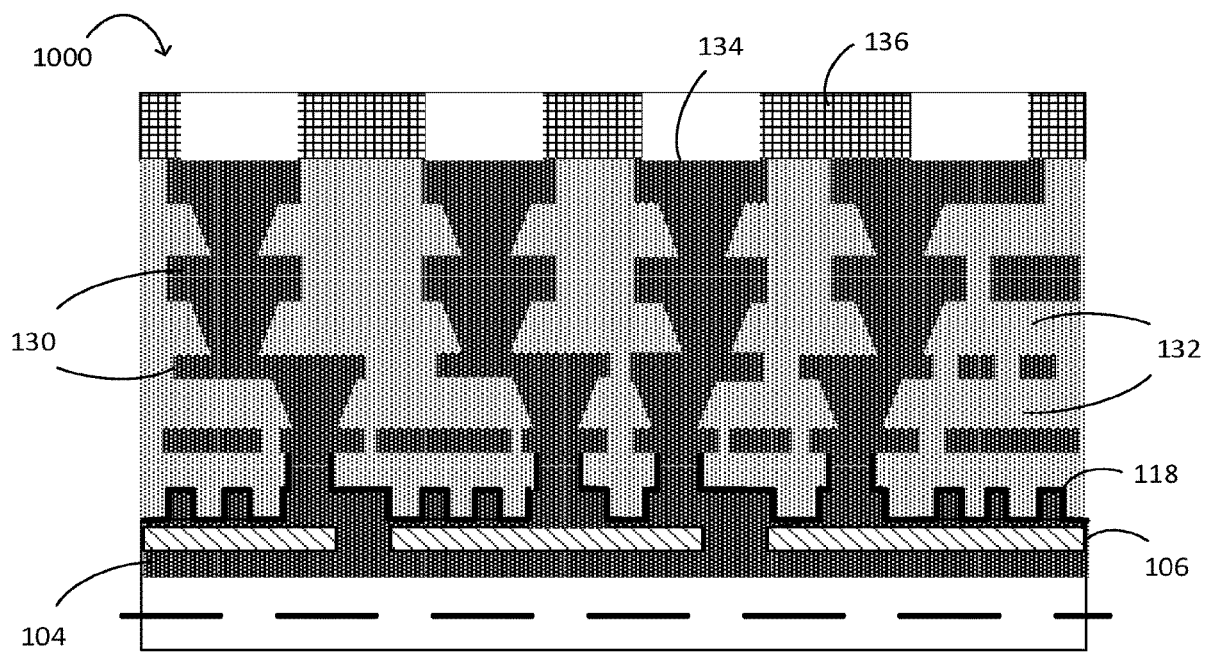

FIG. 10 illustrates assembly 1000 subsequent to continuing the build up process as shown in FIGS. 8 and 9 to build additional trace layers connected by vias on assembly 900 to form the package substrate. In FIG. 10, substrate formation is still being performed on both sides of the carrier, however, for a clearer illustration, the bottom side has been omitted from the figure. After the build up process is finished, solder resist 136 is applied on the back side to form regions 134 where solder may be applied for attachment to a circuit board. The back side of the package substrate bump pitch may be any suitable value, for example, between 200 um-1000 um. The I/O of the package substrate may be any suitable value, for example, between 15-60 I/O/mm/layer.

Figure 11:
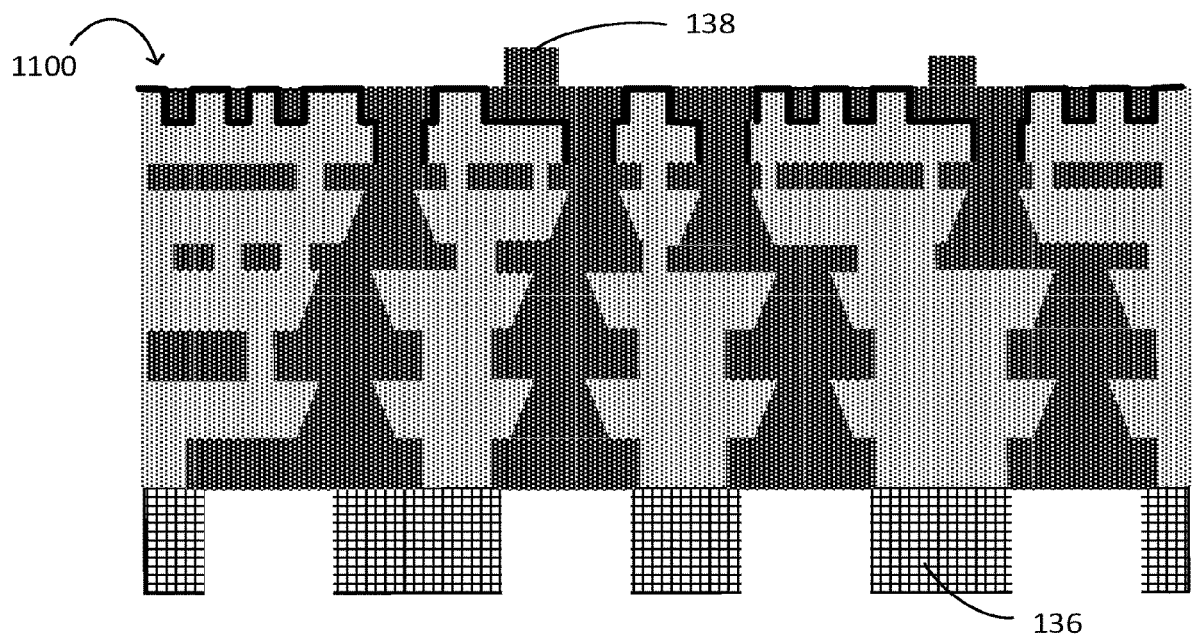

FIG. 11 illustrates assembly 1100, which is assembly 1000 subsequent to separating or removing the assembly from the carrier. Following separation, the substrate assembly may be significantly less rigid and, in some embodiments, may have a temporary carrier attached on the solder resist side 136, which is the back side. Once the carrier is removed, the first metal layer may be removed, for example, by etching, and a selective metal etch may be used to remove the second metal layer while maintaining the integrity of the pillars 138.

Figure 12:
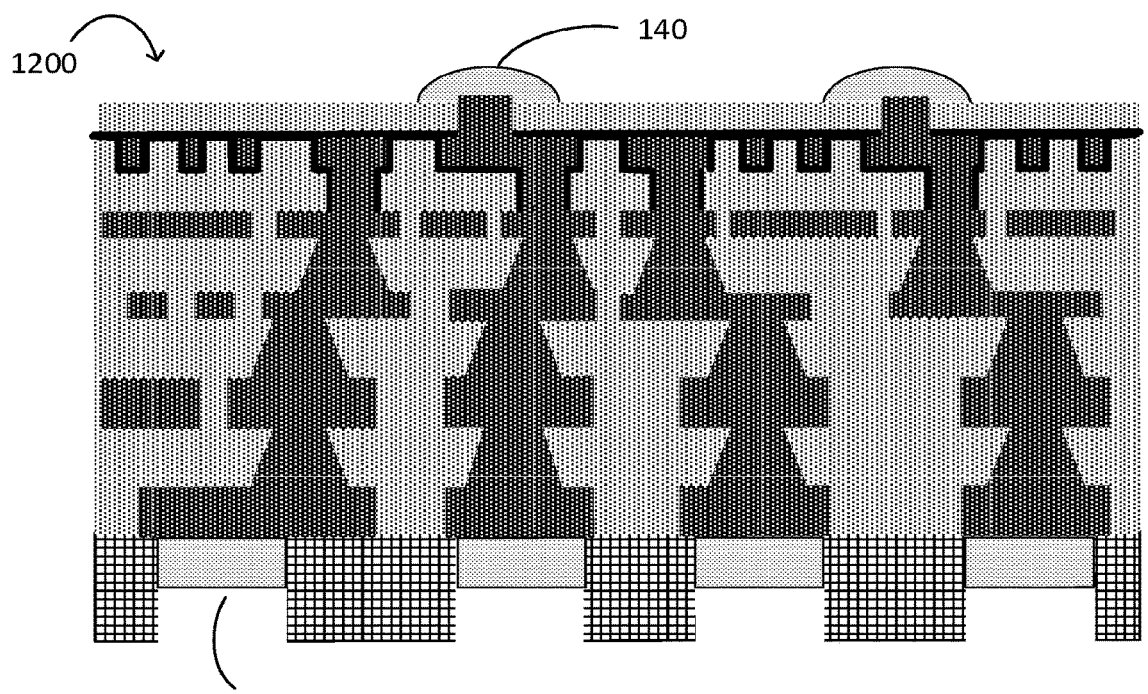

FIG. 12 illustrates assembly 1200 subsequent to depositing an adhesion promoter, laminating dielectric, and exposing the top surface of the pillars on the active side of assembly 1000 for die attachment. Dielectric lamination, via formation, and via exposure may be performed as described previously for the high-density layer in FIGS. 6 and 7. In some embodiments, a surface finish 140, 142 may be applied, such as an electroless metal or patterned copper to enlarge the available metal area for die attachment. In some embodiments, assembly may be performed on the exposed copper with the surface protected by a thin surface finish, such as Organic Solderability Preservative (OSP) or immersion gold (Au).

Dielectric layers may be formed with any suitable process, such as lamination or slit coating and curing, and with any suitable material, such as epoxy with silica. In some embodiments, dielectric layers are formed to a thickness that will completely cover a top surface of the one or more vias to account for uneven surfaces. In some embodiments, the thickness of dielectric layers may be minimized to reduce the etching time required to expose the one or more vias in a subsequent processing operation.

Photoresist layers may be formed with any suitable process, such as lamination, and may have positive tone or negative tone to create crosslinked and non-crosslinked portions using ultraviolet for patterning conductive material layer. Non-crosslinked portions dissolve to form openings where conductive material may be deposited.

The finished substrate may be a single package substrate or may be a repeating unit that may undergo a singulation process in which each unit is separated for one another to create a single package substrate. Singulated substrates may be any suitable size and any suitable thickness; typically, substrates may be 50 mm by 50 mm in size, and between 100 um and 2000 um in thickness.

Figure 13A:
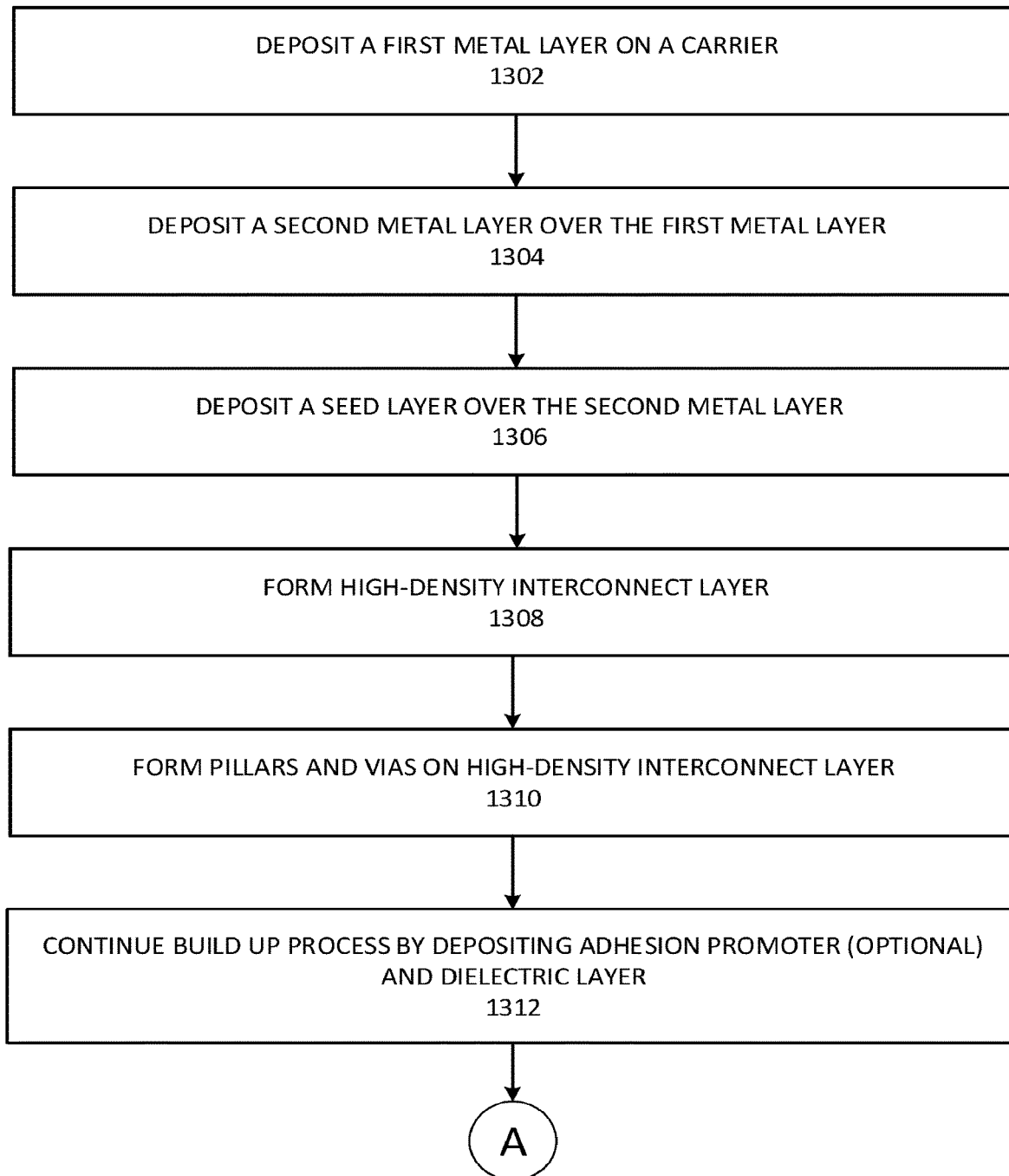
FIGS. 13A-B are a flow diagram of an example method of manufacturing a package substrate including a high-density interconnect layer for scaling interconnects, in accordance with various embodiments.
Figure 13B:
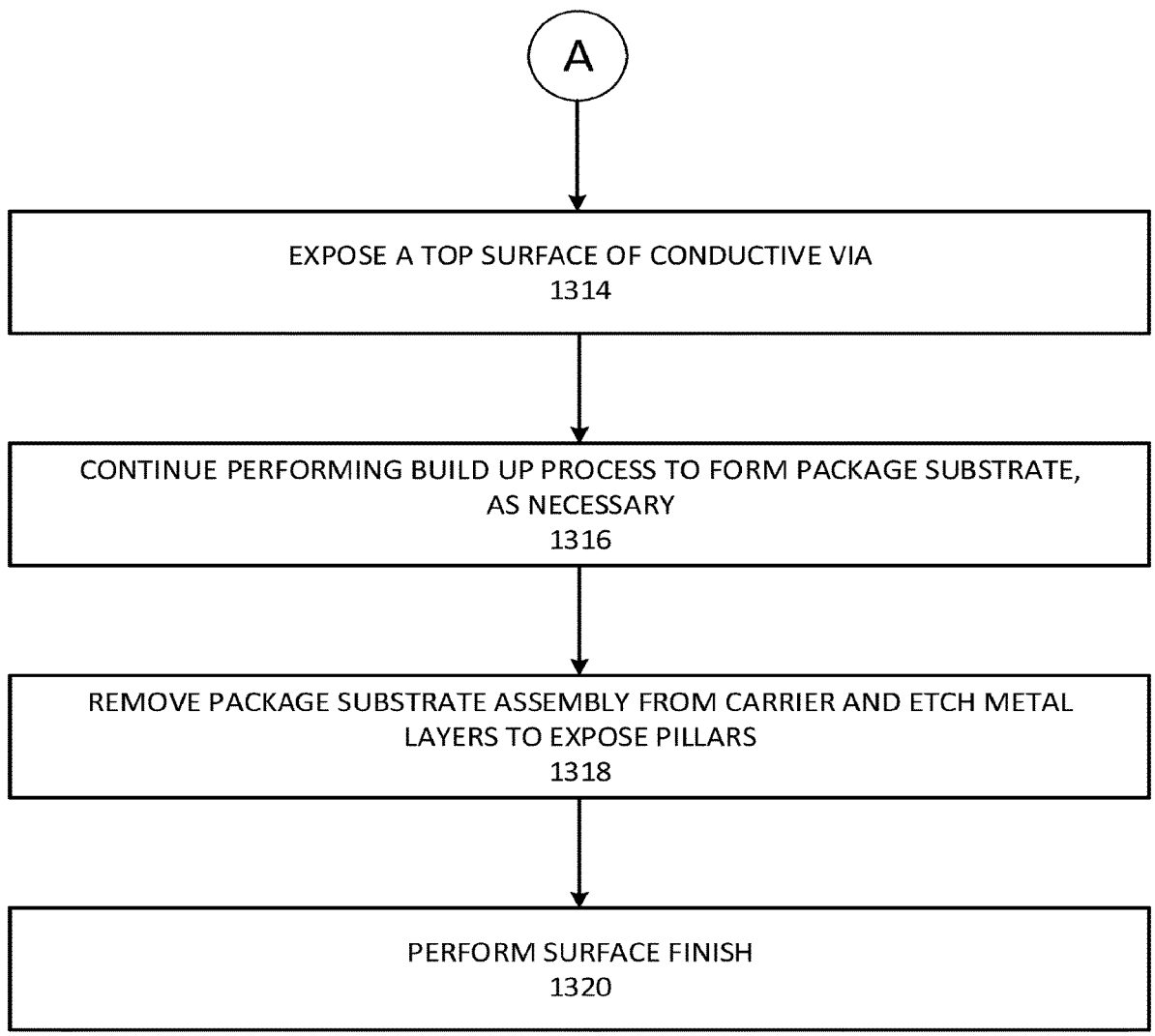

FIGS. 13A-B are a flow diagram of an example method of manufacturing a package substrate including a high-density interconnect layer for scaling interconnects, in accordance with various embodiments. Although the various operations discussed with reference to the method are shown in a particular order, the operations may be performed in any suitable order (e.g., in any combination of parallel or series performance), and may be repeated or omitted as suitable.

At 1302, a first metal layer may be provided on a carrier. For example, a copper foil layer 104 may be laminated on a temporary carrier 102.

At 1304, a second metal layer may be provided on the first metal layer. For example, a nickel layer 106 may be plated or laminated on the copper foil layer 104.

At 1306, a seed layer may be provided on the second metal layer. For example, a copper seed layer 108 may be sputtered onto the nickel layer 106.

At 1308, the high-density layer may be formed. For example, photoresist may be applied to the top metal layer on the carrier, the high-density may be lithographically patterned, and copper traces may be plated following the patterning.

At 1310, self-aligned pillars and vias may be formed on the high-density layer as described below in FIGS. 22-28. Once pillars and vias are formed, all photoresist may be removed.

At 1312, an adhesion promoter and dielectric layer may be provided on the patterned conductive traces and vias. For example, the exposed copper traces and vias of the high-density layer may be treated with an adhesion promoter and a dielectric layer may be laminated over the high-density layer.

At 1314, the top surface of the vias may be revealed by etching or planarizing dielectric layer.

At 1316, the package substrate build up process may be performed to form multiple layers of conductive traces and vias. The package substrate build up process may be performed to route signals according to well-known design rules (e.g. 10/10 um L/S and 50 um via) after the high-density interconnect layer has been used to fan out the bump pitch from fine to course (e.g. 40 um BP to 110 um BP). At 1318, after the package substrate build up process is complete, the package substrate may be removed from the carrier, and the first and second metal layers may be removed, for example, by chemical etching.

At 1320, the exposed copper surface may be finished by applying an adhesion promoter, laminating a dielectric layer, exposing the top surface of the pillars, and applying a surface finish for die attachment to the pillars.

In some embodiments, cavities for embedding and attaching dies to the scaled interconnects are provided. For example, a memory die with 40 um BP may be fanned out using the high-density layer, then routed using standard package substrate design rules to the logic die attached in the cavity. Since the logic die has a larger bump pitch, space on the high-density layer may be conserved by placing the logic die in a cavity which follows standard package substrate design rules. Additionally, by placing the die in a cavity, the x/y dimensions of the substrate are reduced as well as the cost of production.

FIGS. 14-20 are cross-sectional side views of various stages in the manufacture of a package substrate including a high-density layer for scaling interconnects and an integrated die cavity, in accordance with various embodiments. In FIGS. 14-20, substrate formation is still being performed on both sides of the carrier, however, for a clearer illustration, the bottom side has been omitted from the figure.

Figure 14:
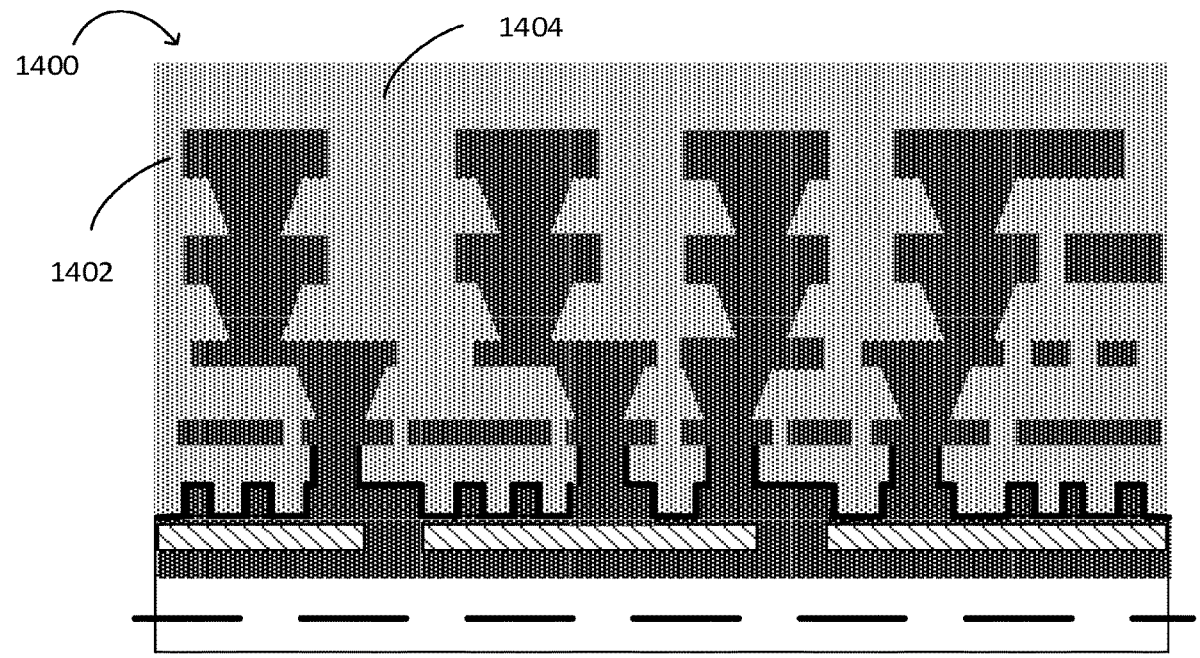
FIGS. 14-20 are cross-sectional side views of various stages in the manufacture of a package substrate having a high-density interconnect layer for scaling interconnects and an integrated cavity, in accordance with various embodiments.

FIG. 14 illustrates assembly 1400 subsequent to continuing the package substrate build up process on assembly 900. In FIG. 14, the build up process is continued as necessary to scale interconnects. When the build up process is complete for a particular fan out, a dielectric layer 1404 may be deposited over the top conductive layer 1402.

Figure 15:
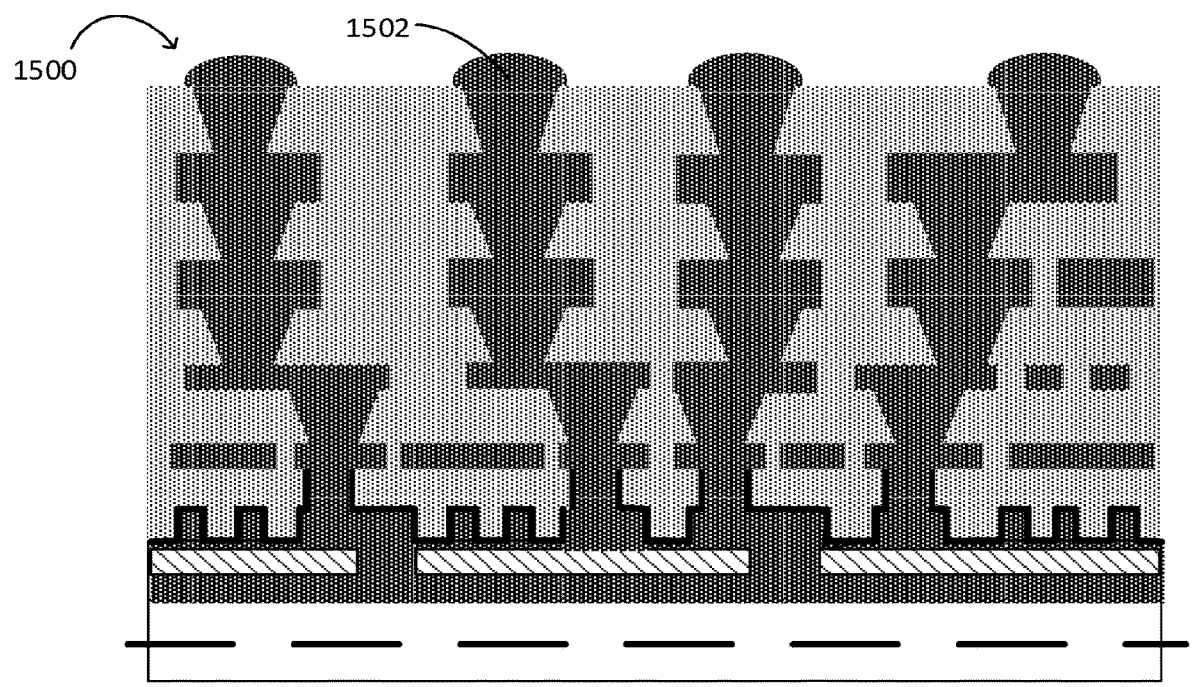

FIG. 15 illustrates assembly 1500 subsequent to forming vias 1502 in dielectric layer 1404 of assembly 1400. Vias may be formed by any suitable process, such as by laser drilling, desmearing, and electrolytic plating.

Figure 16:
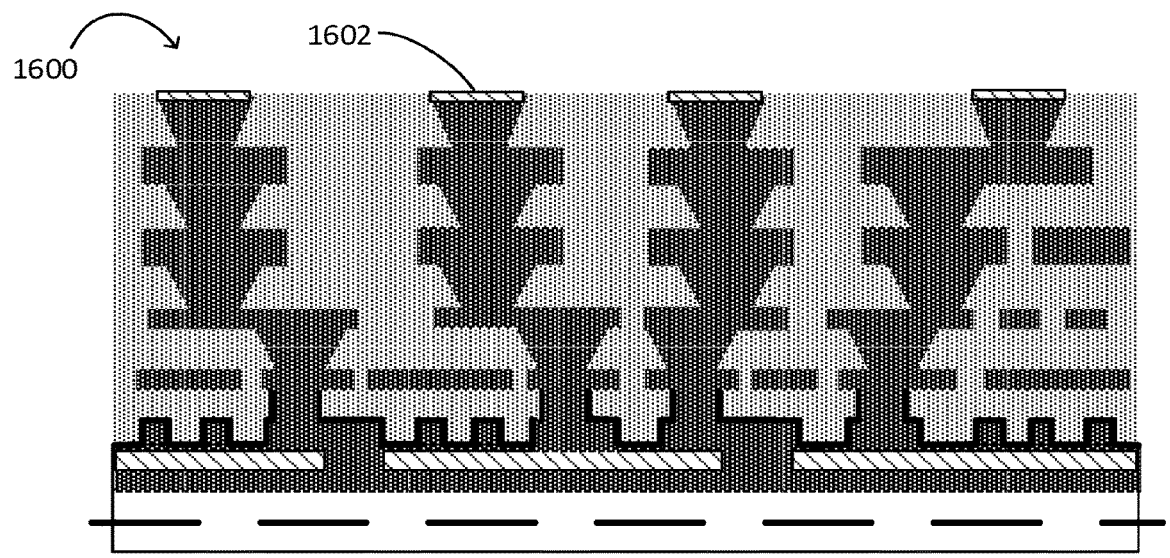

FIG. 16 illustrates assembly 1600 subsequent to planarizing and depositing an etch stop material 1602 to the top surface of vias 1502 of assembly 1500. The etch stop material may be any suitable material, such as tin, and may be applied by any suitable process, such as immersion.

Figure 17:
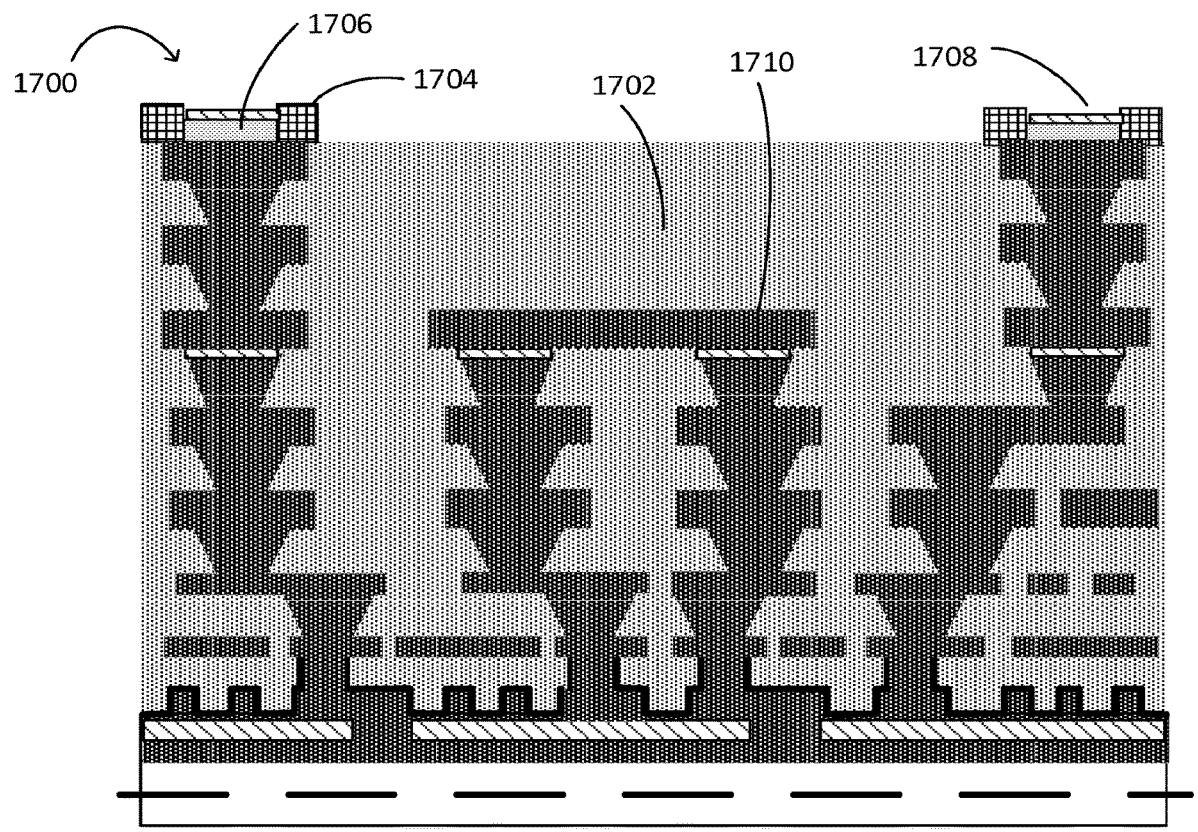

FIG. 17 illustrates assembly 1700 subsequent to continuing the build up process of assembly 1600 to finish the substrate through surface finish and to create a cavity 1702, and may include a temporary metal pad 1710 (e.g., copper pad) that may act as a stop point for drilling when opening the cavity as described below. Finishing of the back side, as described previously, may include depositing an adhesion promoter, laminating dielectric, and exposing the top surface of the vias for attachment to a circuit board, or other board. Dielectric lamination, via formation, and via exposure may be performed as described previously for the high-density layer in FIGS. 6 and 7. Finishing may also include applying solder resist 1704. In some embodiments, a surface finish 1706 may be applied, such as an electroless metal or patterned copper, as well as an etch stop material 1708, such as immersion tin or nickel.

Figure 18:
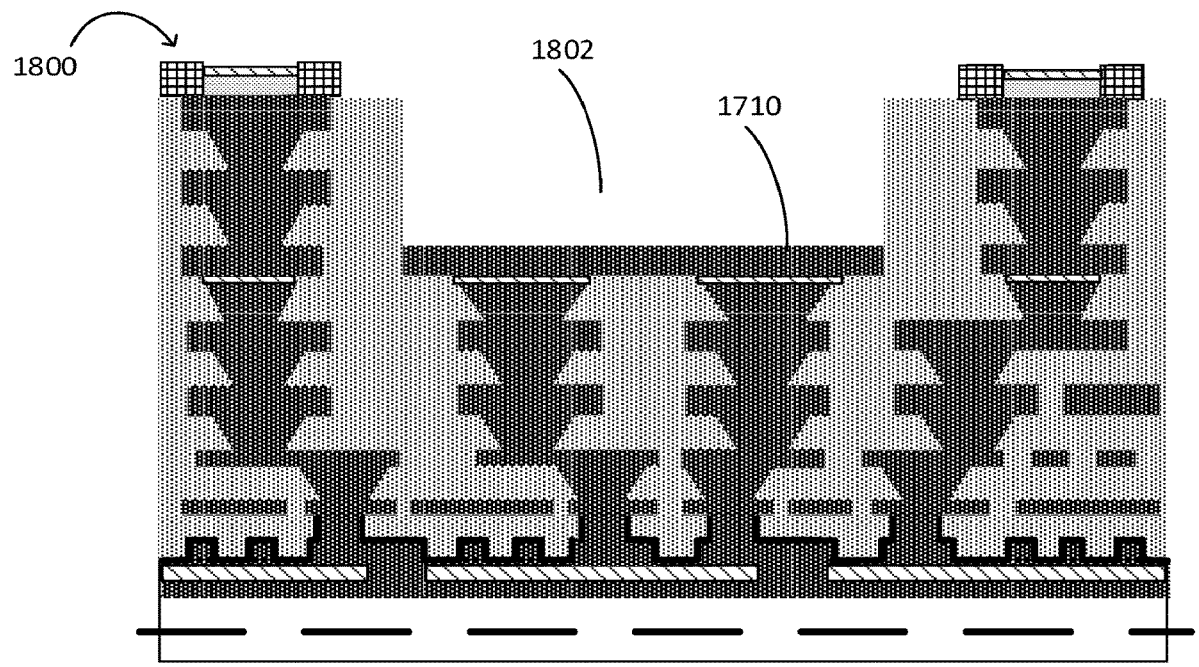

FIG. 18 illustrates assembly 1800 subsequent to opening the cavity 1802 of assembly 1700. The cavity may be opened by any suitable means, including laser drill, sandblasting, and wet/dry etching of the dielectric build up material.

Figure 19:
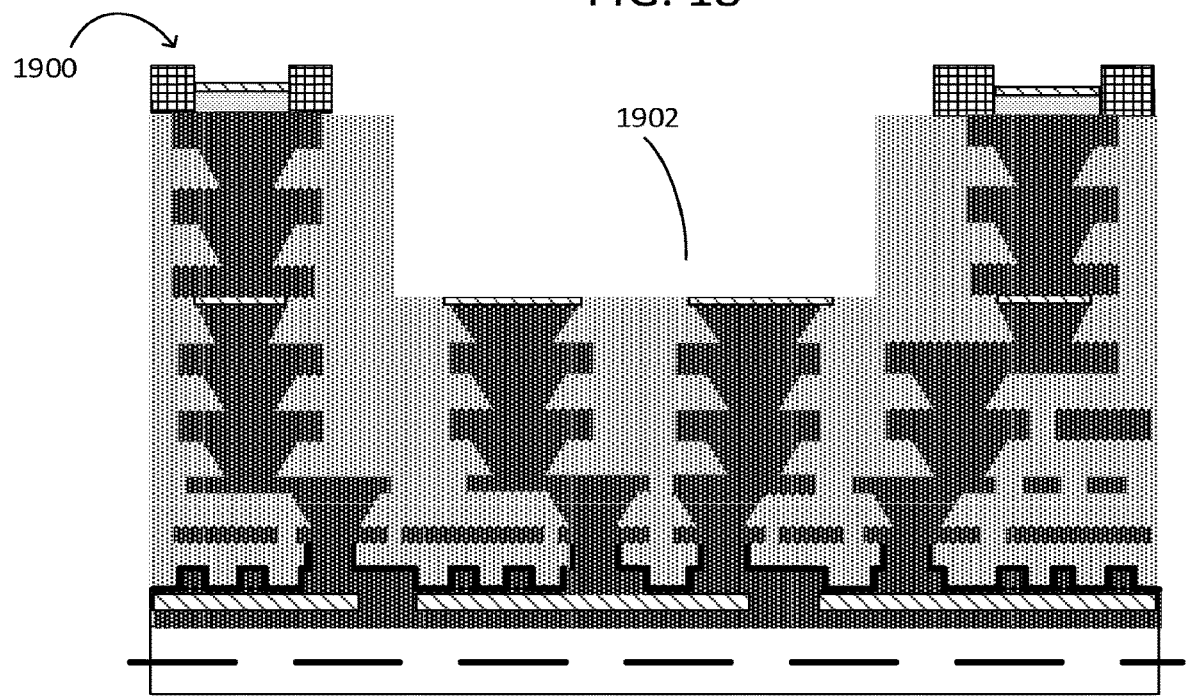

FIG. 19 illustrates assembly 1900 subsequent to selectively etching the temporary copper pad from the open cavity 1902 in the package substrate. For example, immersion tin may act as an etch stop as etch solution selectivity for tin to copper is >1000:1, such that the temporary copper pad may be removed. Additionally, the temporary copper pad may act as a stop for cavity drilling when opening the cavity. The advantage of using the etch stop is that routing may be allowed underneath and through the cavity.

Figure 20:
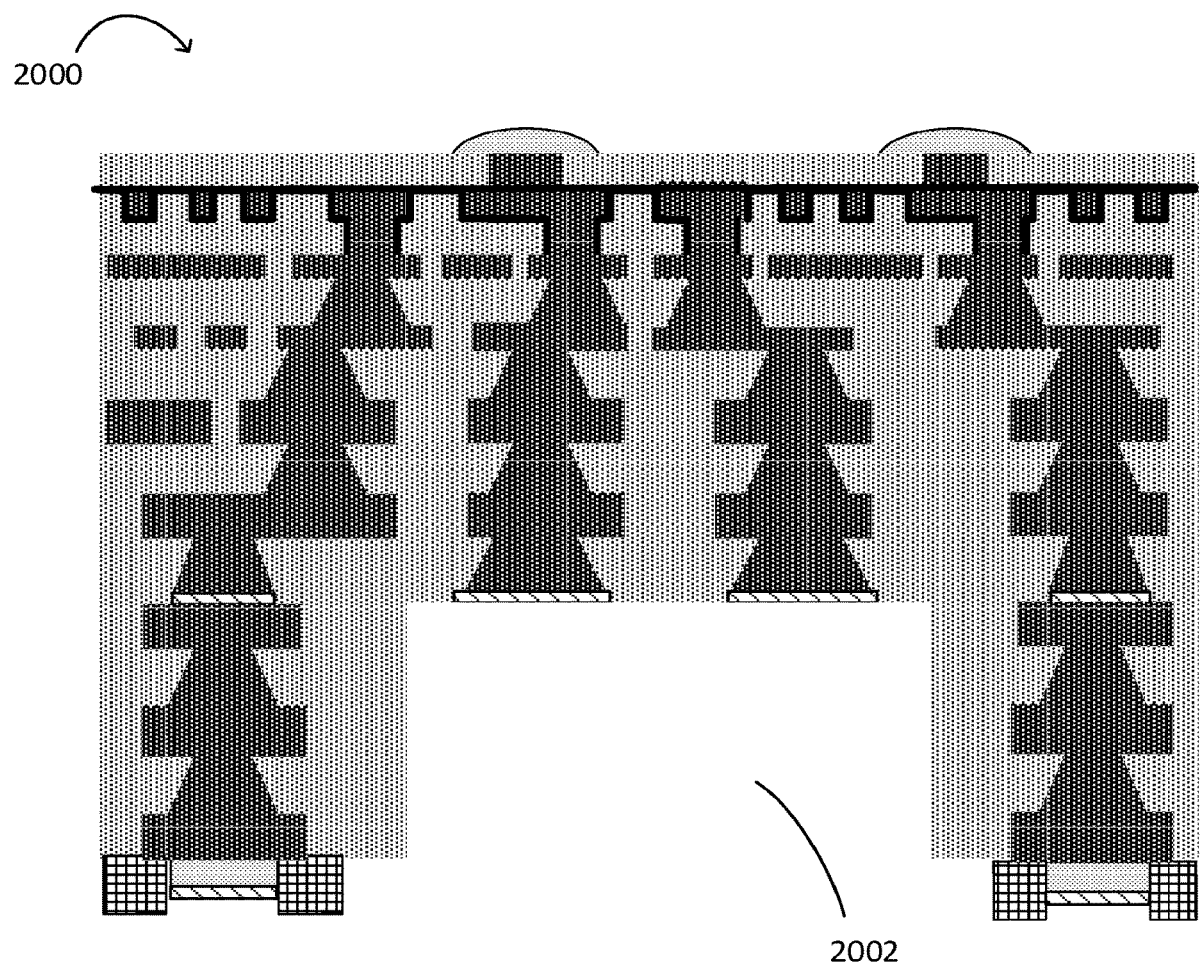

FIG. 20 illustrates assembly 2000, which is assembly 1900 subsequent to separating the assembly from the carrier and finishing the active side, as described above with reference to FIGS. 11-12.

Figure 21:
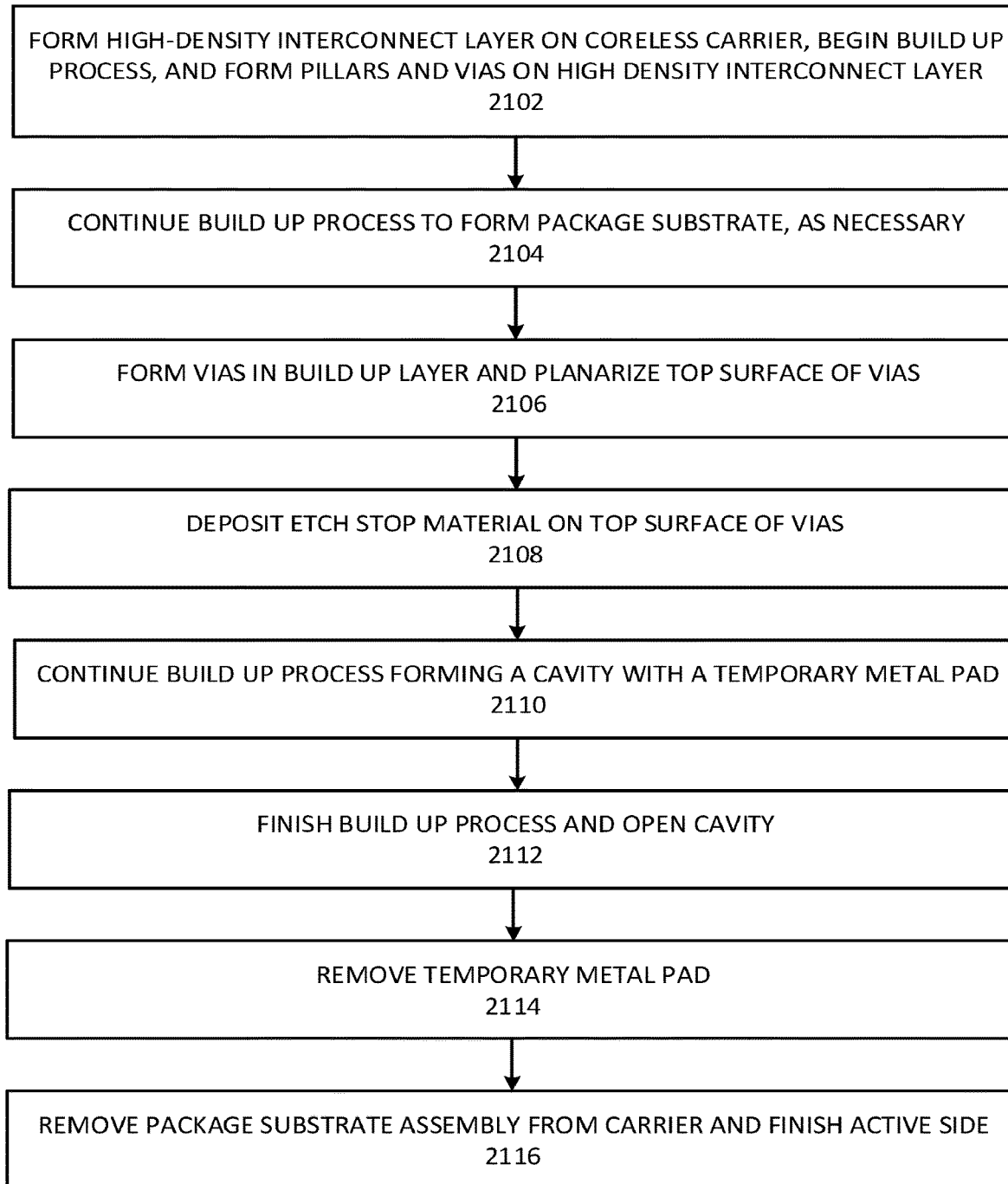
FIG. 21 is a flow diagram of an example method of manufacturing a package substrate including a high-density interconnect layer for scaling interconnects and an integrated cavity, in accordance with various embodiments.

FIG. 21 is a flow diagram of an example method of manufacturing a package substrate including a high-density interconnect layer for scaling interconnects and an integrated die cavity as shown in FIGS. 14-20, in accordance with various embodiments.

At 2102, a high-density layer may be formed on a coreless carrier and the build up process may begin. Additionally, pillars and vias may be formed on the high-density layer. At 2104, the build up process may be continued to fan out routing as necessary. At 2106, package substrate vias may be formed and planarized on the top surface. At 2108, etch stop material may be deposited on the top surface of the planarized vias. At 2110, the build up process may be continued and a cavity with a temporary metal pad may be formed. At 2112, the build up process may be finished and the cavity may be opened. At 2114, the temporary metal pad may be removed. At 2116, the substrate assembly may be removed from the carrier and the active side may be finished.

FIGS. 22-27 illustrate an example process flow for the formation of self-aligned pillars based on a coreless high-density layer. Self-alignment may result in smaller pads than are typically available. These smaller pads may be used to increase the IO density by having more routing traces and/or to decrease the bump pitch.

Figure 22A:
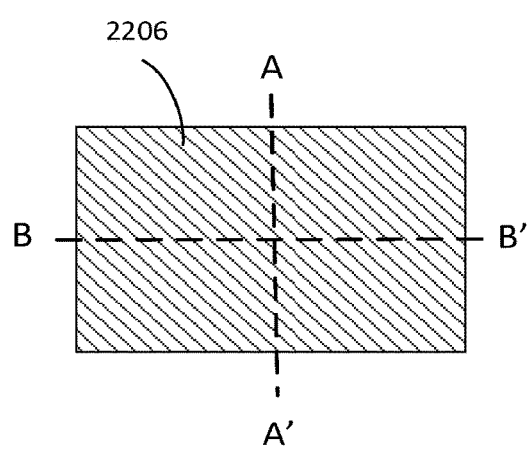
FIG. 22A is a plan view of a carrier layer with foil layers formed over the surfaces in an example method of manufacturing a self-aligned via in a package substrate including a high-density interconnect layer, in accordance with various embodiments.
Figure 22B:
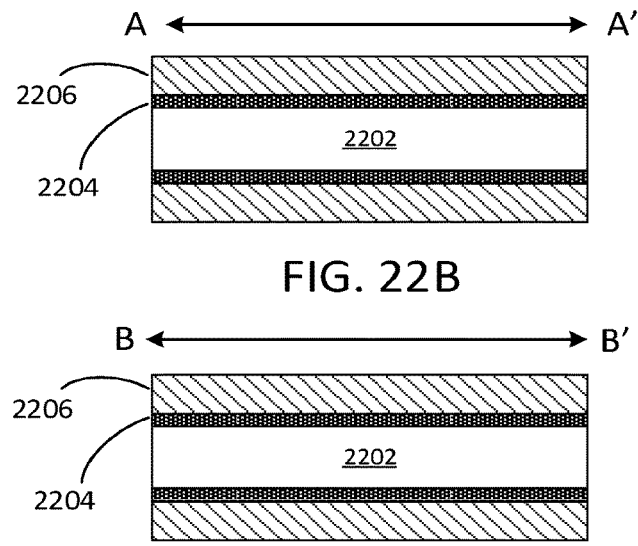
FIGS. 22B-C are two corresponding cross-sectional views of a carrier layer with foil layers formed over the surfaces, in accordance with various embodiments.
Figure 22C:
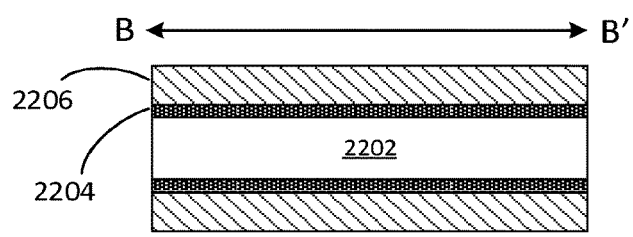

FIG. 22A shows a plan view of a carrier layer with foil layers formed over the surfaces in an example method of manufacturing a self-aligned pillar in a package substrate including a high-density interconnect layer, in accordance with various embodiments. FIGS. 22B-C show two corresponding cross-sectional views of a carrier layer with foil layers formed over the surfaces. Although the figures show this process as a two-sided process, the process may be performed on a single side of the carrier. Further, although the figures show the formation of one pillar, one or more pillars may be formed at the same time or the process may be repeated for a single pillar to form additional pillars.

Referring to FIGS. 22B-C, a first metal layer 2204 (e.g., copper) may be deposited over a top and bottom surface of a carrier substrate 2202. The first metal layer 2204 may be any suitable metal, including nickel, tin, or copper, among others. The first metal layer 2204 may be any suitable metal, including nickel, tin, or copper, among others. A second metal layer 2206 (e.g., nickel) may be deposited over the first metal layer 2204. Optionally, the second metal layer may be covered with a sputtered or electroless copper layer (not shown) to improve adhesion to a photoresist layer.

Figure 23A:
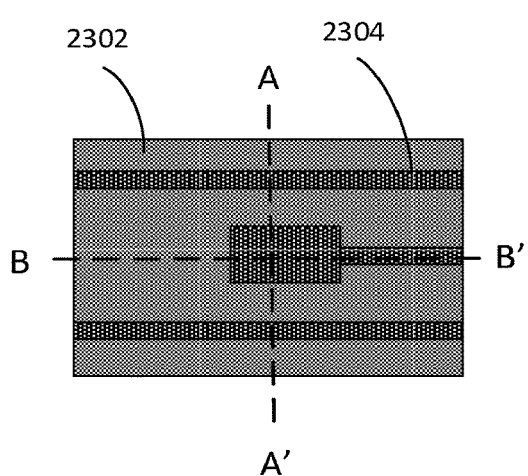
FIG. 23A is a plan view of the carrier layer after a first photoresist layer has been patterned over the surfaces, in accordance with various embodiments.
Figure 23B:
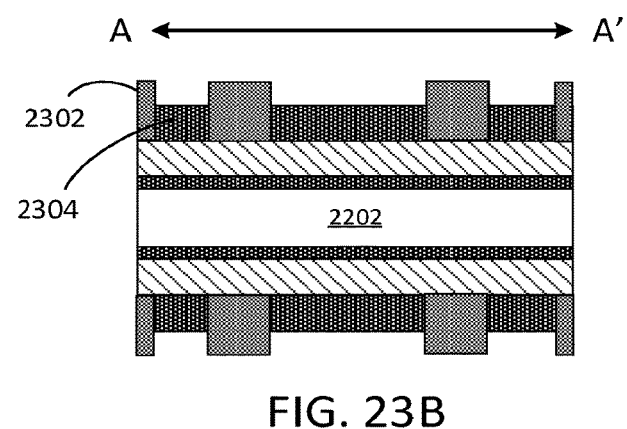
FIGS. 23B-C are two corresponding cross-sectional views of the carrier layer after a first photoresist layer has been patterned over the surfaces, in accordance with various embodiments.
Figure 23C:
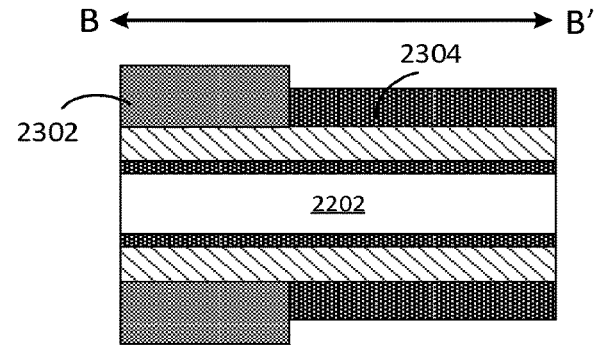

FIG. 23A shows a plan view of the carrier layer after a first photoresist layer has been patterned over the surfaces, in accordance with various embodiments. FIGS. 23B-C show two corresponding cross-sectional views of the carrier layer after a first photoresist layer has been patterned over the surfaces.

Referring to FIGS. 23B-C, a first photoresist layer 2302 may be formed over the second metal layer 2206, patterned to provide openings for high-density conductive lines, and plated with copper to form the high-density conductive lines 2304. The first photoresist layer may be patterned using lithographic patterning processes (e.g., exposed with radiation source through a routing layer mask and developed with a developer), or any other suitable process. The high-density conductive lines may form a high-density layer (e.g., 2/2 um L/S and 14 um pad). The high-density conductive lines 2304 may be formed with electrolytic copper plating, copper sputtering, or the like.

Figure 24A:
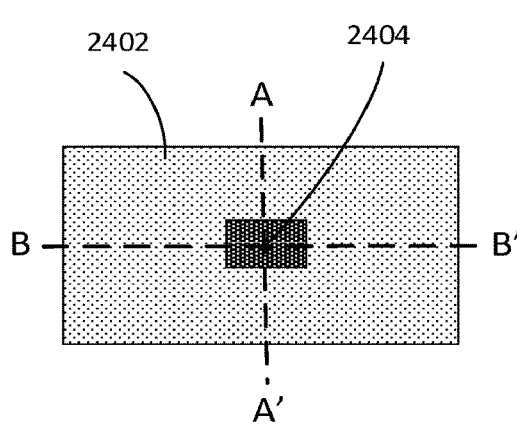
FIG. 24A is a plan view of the carrier layer after a second photoresist layer has been patterned over the surfaces, in accordance with various embodiments.
Figure 24B:
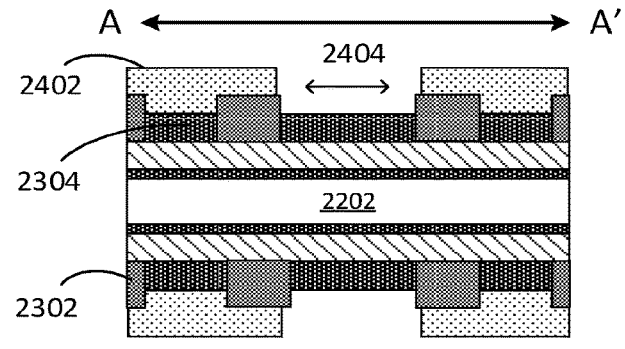
FIGS. 24B-C are two corresponding cross-sectional views of the carrier layer after a second photoresist layer has been patterned over the surfaces, in accordance with various embodiments.
Figure 24C:
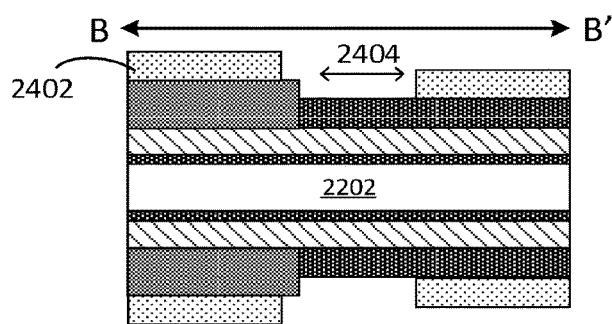

FIG. 24A shows a plan view of the carrier layer after a second photoresist layer has been patterned over the surfaces, in accordance with various embodiments. FIGS. 24B-C show two corresponding cross-sectional views of the carrier layer after a second photoresist layer has been patterned over the surfaces.

Referring to FIGS. 24B-C, a second photoresist layer 2402 may be formed over the first photoresist layer 2302 and conductive lines 2304, and patterned to provide a pillar opening 2404. As shown in FIGS. 24B-C, three of the four walls of the pillar opening 2404 are defined by the first photoresist layer 2302 and the fourth wall is defined by the second photoresist layer 2402.

Figure 25A:
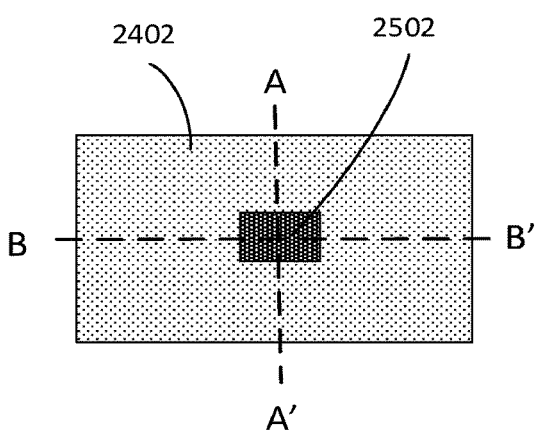
FIG. 25A is a plan view of the carrier layer after exposed metal portions have been etched, in accordance with various embodiments.
Figure 25B:
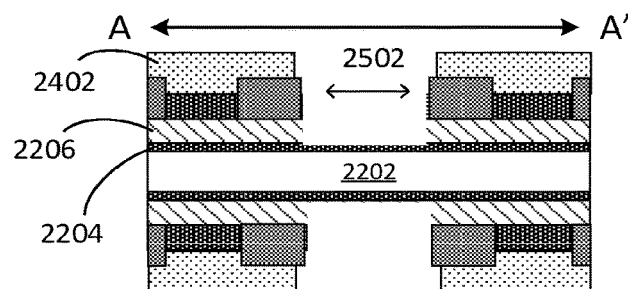
FIGS. 25B-C are two corresponding cross-sectional views of the carrier layer after exposed metal portions have been etched, in accordance with various embodiments.
Figure 25C:
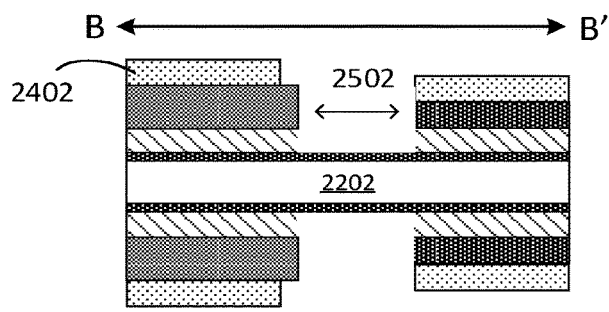

FIG. 25A shows a plan view of the carrier layer after exposed metal portions have been etched, in accordance with various embodiments. FIGS. 25B-C shows two corresponding cross-sectional views of the carrier layer after exposed metal portions have been etched.

Referring to FIGS. 25B-C, the exposed copper in the pillar opening may be removed by, for example, subtractive etching solution with a high etch factor to minimize the expansion of the etch into the lines. Subsequent to removing the copper, a selective etch for the second metal layer 2206 (e.g., nickel layer) may be applied to remove the second metal layer in the pillar opening 2502. Nickel etching solutions with selectivity of 10:1 over copper are known in the art. For example, if the nickel metal layer is approximately 5 um thick, only approximately 500 nm of the copper will be etched as well. Further, first metal layer 2204 (i.e., copper layer) may act as an etch stop.

Figure 26A:
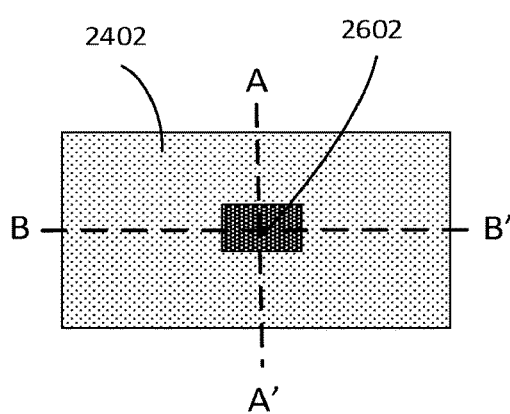
FIG. 26A is a plan view of the carrier layer after metal has been plated to fill the vias, in accordance with various embodiments.
Figure 26B:
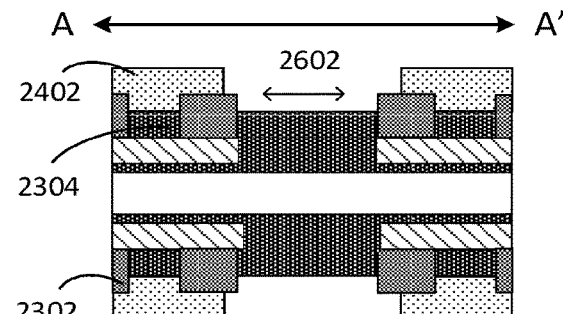
FIGS. 26B-C are two corresponding cross-sectional views of the carrier layer after metal has been plated to fill the vias, in accordance with various embodiments.
Figure 26C:
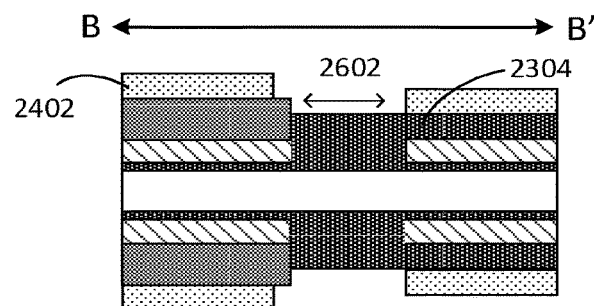

FIG. 26A shows a plan view of the carrier layer after metal has been plated to fill the pillar, in accordance with various embodiments. FIGS. 26B-C shows two corresponding cross-sectional views of the carrier layer after metal has been plated to fill the pillar.

Referring to FIGS. 26B-C, after etching, the pillar opening 2602 may be replated with copper up to the level of the copper line 2304, for example, approximately, 7 um thick. The copper may be replated using any suitable process, such as, electroless or electrolytic plating. However, the plating process should be controlled to deposit the copper to avoid overfilling and impinging on the next layer of dielectric, which may have a thickness of approximately 3 um. The desired tolerance for copper plating thickness is ±30%.

Figure 27A:
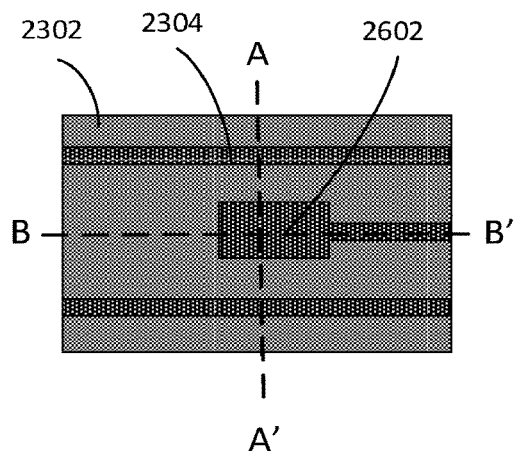
FIG. 27A is a plan view of the carrier layer after the second photoresist layer has been removed, in accordance with various embodiments.
Figure 27B:
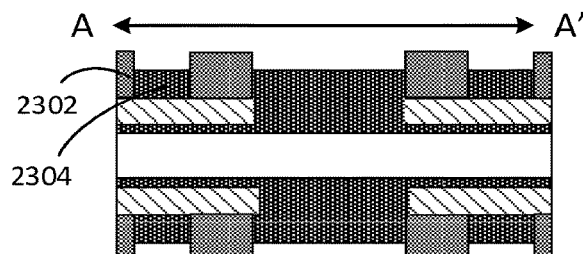
FIGS. 27B-C are two corresponding cross-sectional views of the carrier layer after the second photoresist layer has been removed, in accordance with various embodiments.
Figure 27C:
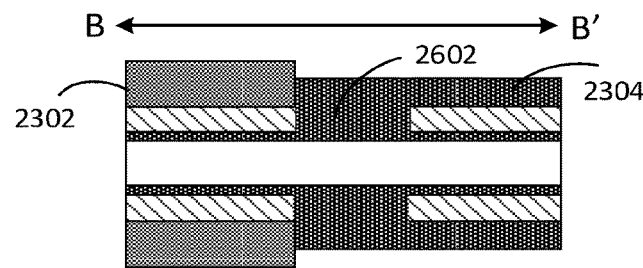

FIG. 27A shows a plan view of the carrier layer after the second photoresist layer has been removed, in accordance with various embodiments. FIGS. 27B-C show two corresponding cross-sectional views of the carrier layer after the second photoresist layer has been removed.

Referring to FIGS. 27B-C, the second photoresist layer 2402 may be removed while leaving the first photoresist layer 2302 in place. If self-aligned vias are being formed, the second photoresist layer should be removed without removing the first photoresist layer. In some embodiments, the first photoresist layer 2302 may be a permanent photoreactive material that will not be stripped when the second photoresist layer is removed. In some embodiments, the first photoresist layer may be protected by a copper (or other metal) seed layer. In some embodiments, where self-aligned vias are not being formed, the first photoresist layer may be removed.

The process for forming self-aligned vias on the high-density layer is the same as shown in FIGS. 22-27 except that the etching process for removing metal layers may be omitted. The second photoresist layer may be patterned to form pillars and vias, or once the self-aligned pillars are formed, the second photoresist layer may be removed, then reapplied and patterned to form self-aligned via openings. The openings may be plated to form self-aligned vias, and the second photoresist layer may be removed.

As described above, when the build up process (i.e., SAP) is complete, the package substrate assembly may be separated from the temporary carrier and the nickel metal layer may be etched away, for example, using the same selective etch solution used for pillar formation to reveal the copper pillars. A dielectric layer may be laminated over the copper pillars. The top surface of the pillars subsequently may be subsequently revealed by a mechanical, chemical, or plasma etchback. The pillars allow for the high-density interconnects to be covered by dielectric and increase the routing density on the high-density layer.

Figure 28:
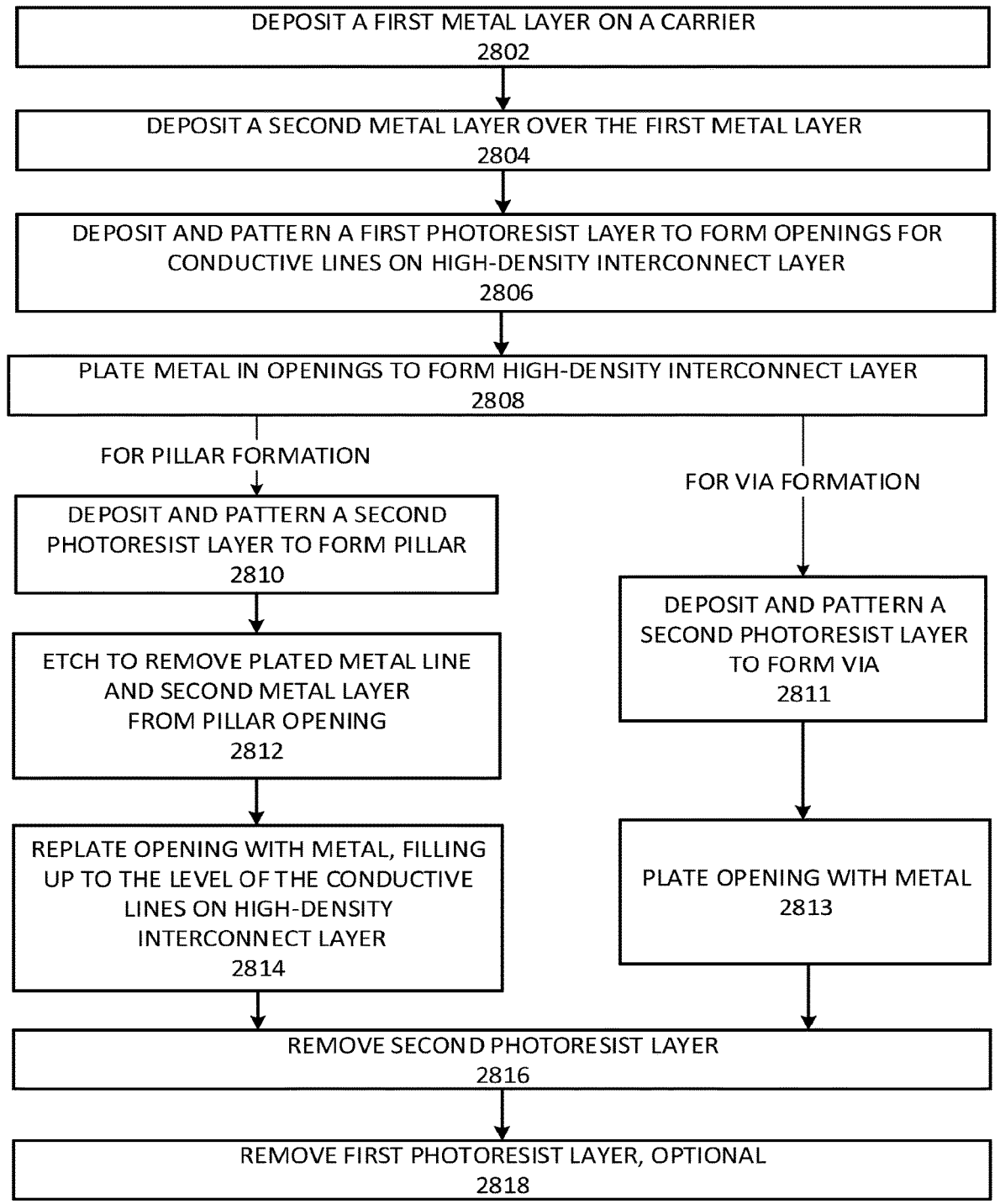
FIG. 28 is a flow diagram of an example method of forming a self-aligned via in a package substrate including a high-density interconnect layer as shown in FIGS. 22-28, in accordance with various embodiments.

FIG. 28 is a flow diagram of an example method of forming self-aligned pillars and vias in a package substrate that includes a high-density interconnect layer, in accordance with various embodiments.

At 2802, a first metal layer (e.g., copper) may be deposited on a carrier. At 2804, a second metal layer (e.g., nickel) may be deposited over the first metal layer.

At 2806, a first photoresist layer may be deposited and patterned to form conductive line openings.

At 2808, a conductive material (e.g., copper) may be deposited in the openings to form patterned conductive lines.

At 2810, a second photoresist layer may be deposited and patterned to create an opening for a pillar or, at 2811, a second photoresist layer may be deposited and patterned to create an opening for a via. The pillar and via openings may be formed by the first and second photoresist layers.

At 1812, for pillar formation, the pillar opening may be etched to selectively remove the conductive line, then etched to selectively remove the second metal layer. Etching is not necessary for via formation and may be omitted.

At 2814, conductive material (e.g., copper) may be deposited into the pillar opening to form a pillar and, at 2813, in the via opening to form a via. The pillar opening may be plated with conductive material, such that the conductive material of the pillar is approximately level with the conductive lines. The via opening may be plated with conductive material to form a connection to the next conductive layer.

At 2816, once pillar(s) and via(s) are formed, the second photoresist layer may be removed.

Additional pillars and vias may be formed on the high-density layer by repeating the process for each as described starting at 2810, or by patterning the photoresist layers for additional pillars and/or vias. At 2818, once pillar formation and via formation on the high-density interconnect layer is complete, the first photoresist layer may be removed.

The package substrates disclosed herein may be included in any suitable electronic device. FIGS. 29-32 illustrate various examples of apparatuses that may be included in, or that may include, one or more of any of the package substrates disclosed herein.

FIGS. 29A-B are top views of a wafer 2900 and dies 2902 that may take the form of any of the embodiments of the IC structures disclosed herein. The wafer 2900 may be composed of semiconductor material and may include one or more dies 2902 having IC elements formed on a surface of the wafer 2900. Each of the dies 2902 may be a repeating unit of a semiconductor product that includes any suitable IC. After the fabrication of the semiconductor product is complete, the wafer 2900 may undergo a singulation process in which each of the dies 2902 is separated from one another to provide discrete "chips" of the semiconductor product. The die 2902 may include one or more transistors (e.g., some of the transistors 3040 of FIG. 30, discussed below) and/or supporting circuitry to route electrical signals to the transistors, as well as any other IC components. The die 2902 may include one or more conductive pathways. In some embodiments, the wafer 2900 or the die 2902 may include a memory device (e.g., a static random access memory (SRAM) device), a logic device (e.g., an AND, OR, NAND, or NOR gate), or any other suitable circuit element. Multiple ones of these devices may be combined on a single die 2902. For example, a memory array formed by multiple memory devices may be formed on a same die 2902 as a processing device (e.g., the processing device 3202 of FIG. 32) or other logic that is configured to store information in the memory devices or execute instructions stored in the memory array.

FIG. 30 is a cross-sectional side view of an IC device 3000 that may be used with any of the embodiments of the IC structures disclosed herein. The IC device 3000 may be formed on a substrate 3002 (e.g., the wafer 2900 of FIG. 29A) and may be included in a die (e.g., the die 2902 of FIG. 29B). The substrate 3002 may be a semiconductor substrate composed of semiconductor material systems including, for example, N-type or P-type materials systems. The substrate 3002 may include, for example, a crystalline substrate formed using a bulk silicon or a silicon-on-insulator substructure. In some embodiments, the substrate 3002 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 3002. Although a few examples of materials from which the substrate 3002 may be formed are described here, any material that may serve as a foundation for an IC device 3000 may be used. The substrate 3002 may be part of a singulated die (e.g., the dies 2902 of FIG. 29B) or a wafer (e.g., the wafer 2900 of FIG. 29A).

The IC device 3000 may include one or more device layers 3004 disposed on the substrate 3002. The device layer 3004 may be included in the circuitry at the device side of the die of the IC structures disclosed herein. The device layer 3004 may include features of one or more transistors 3040 (e.g., metal oxide semiconductor field-effect transistors (MOSFETs)) formed on the substrate 3002. The device layer 3004 may include, for example, one or more source and/or drain (S/D) regions 3020, a gate 3022 to control current flow in the transistors 3040 between the S/D regions 3020, and one or more S/D contacts 3024 to route electrical signals to/from the S/D regions 3020. The transistors 3040 may include additional features not depicted for the sake of clarity, such as device isolation regions, gate contacts, and the like. The transistors 3040 are not limited to the type and configuration depicted in FIG. 30 and may include a wide variety of other types and configurations such as, for example, planar transistors, nonplanar transistors, or a combination of both. Nonplanar transistors may include FinFET transistors, such as double-gate transistors or tri-gate transistors, and wraparound or all-around gate transistors, such as nanoribbon and nanowire transistors.

Each transistor 3040 may include a gate 3022 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc.

Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 3040 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 3040 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 3020 may be formed within the substrate 3002 adjacent to the gate 3022 of each transistor 3040. The S/D regions 3020 may be formed using either an implantation/diffusion process or an etching/deposition process, for example. In the former process, dopants such as boron, aluminum, antimony, phosphorous, or arsenic may be ion-implanted into the substrate 3002 to form the S/D regions 3020. An annealing process that activates the dopants and causes them to diffuse farther into the substrate 3002 may follow the ion-implantation process. In the latter process, the substrate 3002 may first be etched to form recesses at the locations of the S/D regions 3020. An epitaxial deposition process may then be carried out to fill the recesses with material that is used to fabricate the S/D regions 3020. In some implementations, the S/D regions 3020 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 3020 may be formed using one or more alternate semiconductor materials such as germanium or a group III-V material or alloy. In further embodiments, one or more layers of metal and/or metal alloys may be used to form the S/D regions 3020.

Electrical signals, such as power and/or input/output (I/O) signals, may be routed to and/or from the transistors 3040 of the device layer 3004 through one or more interconnect layers disposed on the device layer 3004 (illustrated in FIG. 30 as interconnect layers 3006-3010), which may be any of the embodiments of the IC structures disclosed herein. For example, electrically conductive features of the device layer 3004 (e.g., the gate 3022 and the S/D contacts 3024) may be electrically coupled with the interconnect structures 3028 of the interconnect layers 3006-3010. The one or more interconnect layers 3006-3010 may form an interlayer dielectric (ILD) stack 3019 of the IC device 3000. The conductive pathways 3012 may extend to, and electrically couple to, one or more of the interconnect layers 3006-3010. The conductive pathways 3012 may route signals to/from the devices in the device layer 3004, or may route signals through the interconnect layers 3006-3010 to/from other devices (e.g., other electronic components in a stacked IC structure, or other components sharing a circuit board with the IC device 3000).

The interconnect structures 3028 may be arranged within the interconnect layers 3006-3010 to route electrical signals according to a wide variety of designs (in particular, the arrangement is not limited to the particular configuration of interconnect structures 3028 depicted in FIG. 30). Although a particular number of interconnect layers 3006-3010 is depicted in FIG. 30, embodiments of the present disclosure include IC devices having more or fewer interconnect layers than depicted.

In some embodiments, the interconnect structures 3028 may include trench structures 3028*a* (sometimes referred to as "lines") and/or via structures 3028*b* (sometimes referred to as "holes") filled with an electrically conductive material such as a metal. The trench structures 3028*a* may be arranged to route electrical signals in a direction of a plane that is substantially parallel with a surface of the substrate 3002 upon which the device layer 3004 is formed. For example, the trench structures 3028*a* may route electrical signals in a direction in and out of the page from the perspective of FIG. 30. The via structures 3028*b* may be arranged to route electrical signals in a direction of a plane that is substantially perpendicular to the surface of the substrate 3002 upon which the device layer 3004 is formed. In some embodiments, the via structures 3028*b* may electrically couple trench structures 3028*a* of different interconnect layers 3006-3010 together.

The interconnect layers 3006-3010 may include a dielectric material 3026 disposed between the interconnect structures 3028, as shown in FIG. 30. In some embodiments, the dielectric material 3026 disposed between the interconnect structures 3028 in different ones of the interconnect layers 3006-3010 may have different compositions; in other embodiments, the composition of the dielectric material 3026 between different interconnect layers 3006-3010 may be the same.

A first interconnect layer 3006 (referred to as Metal 1 or "M1") may be formed directly on the device layer 3004. In some embodiments, the first interconnect layer 3006 may include trench structures 3028*a* and/or via structures 3028*b*, as shown. The trench structures 3028*a* of the first interconnect layer 3006 may be coupled with contacts (e.g., the S/D contacts 3024) of the device layer 3004.

A second interconnect layer 3008 (referred to as Metal 2 or "M2") may be formed directly on the first interconnect layer 3006. In some embodiments, the second interconnect layer 3008 may include via structures 3028*b* to couple the trench structures 3028*a* of the second interconnect layer 3008 with the trench structures 3028*a* of the first interconnect layer 3006. Although the trench structures 3028*a* and the via structures 3028*b* are structurally delineated with a line within each interconnect layer (e.g., within the second interconnect layer 3008) for the sake of clarity, the trench structures 3028*a* and the via structures 3028*b* may be structurally and/or materially contiguous (e.g., simultaneously filled during a dual-damascene process) in some embodiments.

A third interconnect layer 3010 (referred to as Metal 3 or "M3") (and additional interconnect layers, as desired) may be formed in succession on the second interconnect layer 3008 according to similar techniques and configurations described in connection with the second interconnect layer 3008 or the first interconnect layer 3006.

The IC device 3000 may include a solder resist material 3034 (e.g., polyimide or similar material) and one or more bond pads 3036 formed on the interconnect layers 3006-3010. The bond pads 3036 may provide the contacts to couple to the FLI, for example. The bond pads 3036 may be electrically coupled with the interconnect structures 3028 and configured to route the electrical signals of the transistor(s) 3040 to other external devices. For example, solder bonds may be formed on the one or more bond pads 3036 to mechanically and/or electrically couple a chip including the IC device 3000 with another component (e.g., a circuit board). The IC device 3000 may have other alternative configurations to route the electrical signals from the interconnect layers 3006-3010 than depicted in other embodiments. For example, the bond pads 3036 may be replaced by or may further include other analogous features (e.g., posts) that route the electrical signals to external components.

Figure 31:
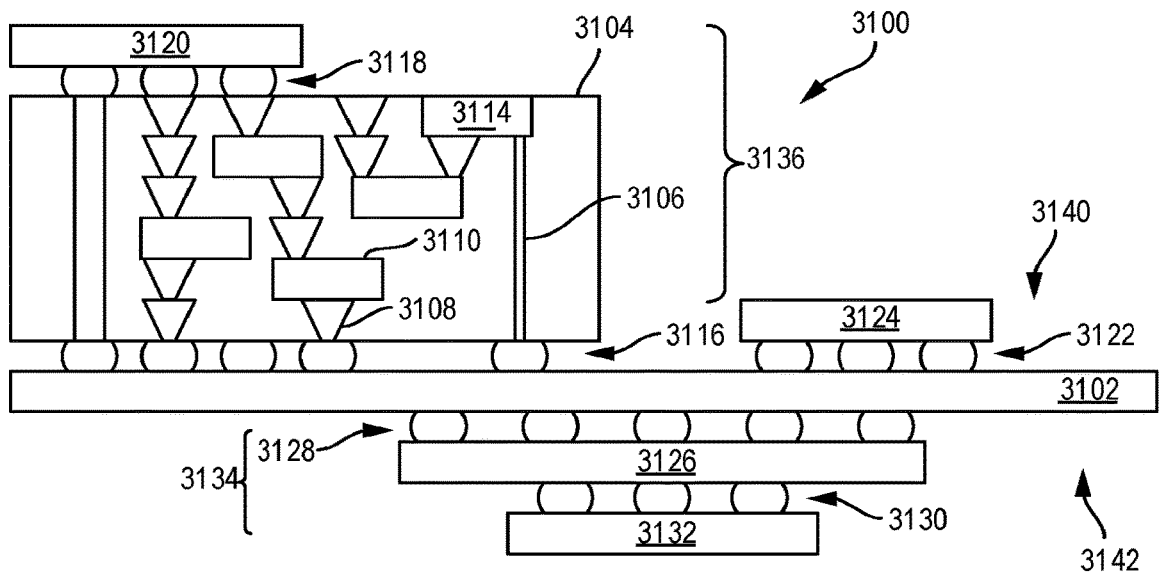
FIG. 31 is a cross-sectional side view of an IC device assembly that may include any of the embodiments of the IC structures disclosed herein.

FIG. 31 is a cross-sectional side view of an IC device assembly 3100 that may include any of the embodiments of the IC structures disclosed herein. The IC device assembly 3100 includes a number of components disposed on a circuit board 3102 (which may be, e.g., a motherboard). The IC device assembly 3100 includes components disposed on a first face 3140 of the circuit board 3102 and an opposing second face 3142 of the circuit board 3102; generally, components may be disposed on one or both faces 3140 and 3142.

In some embodiments, the circuit board 3102 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 3102. In other embodiments, the circuit board 3102 may be a non-PCB substrate.

The IC device assembly 3100 illustrated in FIG. 31 includes a package-on-interposer structure 3136 coupled to the first face 3140 of the circuit board 3102 by coupling components 3116. The coupling components 3116 may electrically and mechanically couple the package-on-interposer structure 3136 to the circuit board 3102, and may include solder balls (as shown in FIG. 31), male and female portions of a socket, an adhesive, an underfill material, and/or any other suitable electrical and/or mechanical coupling structure.

The package-on-interposer structure 3136 may include an electronics package 3120 coupled to an interposer 3104 by coupling components 3118. The coupling components 3118 may take any suitable form for the application, such as the forms discussed above with reference to the coupling components 3116. Although a single electronics package 3120 is shown in FIG. 31, multiple electronics packages may be coupled to the interposer 3104; indeed, additional interposers may be coupled to the interposer 3104. The interposer 3104 may provide an intervening substrate used to bridge the circuit board 3102 and the electronics package 3120. The electronics package 3120 may be or include, for example, a die (the die 2902 of FIG. 29B), an IC device (e.g., the IC device 3000 of FIG. 30), or any other suitable component. Generally, the interposer 3104 may spread a connection to a wider pitch or reroute a connection to a different connection. For example, the interposer 3104 may couple the electronics package 3120 (e.g., a die) to a ball grid array (BGA) of the coupling components 3116 for coupling to the circuit board 3102. In the embodiment illustrated in FIG. 31, the electronics package 3120 and the circuit board 3102 are attached to opposing sides of the interposer 3104; in other embodiments, the electronics package 3120 and the circuit board 3102 may be attached to a same side of the interposer 3104. In some embodiments, three or more components may be interconnected by way of the interposer 3104. In some embodiments, the electronics package 3120 may include an IC structure disclosed herein. An additional electronic component may be disposed on the electronics package 3120 to form a stacked IC structure.

The interposer 3104 may be formed of an epoxy resin, a fiberglass-reinforced epoxy resin, a ceramic material, or a polymer material such as polyimide. In some embodiments, the interposer 3104 may be formed of alternate rigid or flexible materials that may include the same materials described above for use in a semiconductor substrate, such as silicon, germanium, and other group III-V and group IV materials. The interposer 3104 may include metal interconnects 3108 and vias 3110, including but not limited to through-silicon vias (TSVs) 3106. The interposer 3104 may further include embedded devices 3114, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 3104. The package-on-interposer structure 3136 may take the form of any of the package-on-interposer structures known in the art.

The IC device assembly 3100 may include an electronics package 3124 coupled to the first face 3140 of the circuit board 3102 by coupling components 3122. The coupling components 3122 may take the form of any of the embodiments discussed above with reference to the coupling components 3116, and the electronics package 3124 may take the form of any of the embodiments discussed above with reference to the electronics package 3120. In some embodiments, the electronics package 3124 may include any IC structure disclosed herein. An additional electronic component may be disposed on the electronics package 3124 to form a stacked IC structure.

The IC device assembly 3100 illustrated in FIG. 31 includes a package-on-package structure 3134 coupled to the second face 3142 of the circuit board 3102 by coupling components 3128. The package-on-package structure 3134 may include an electronics package 3126 and an electronics package 3132 coupled together by coupling components 3130 such that the electronics package 3126 is disposed between the circuit board 3102 and the electronics package 3132. The package-on-package structure 3134 may take the form of an IC structure disclosed herein. The coupling components 3128 and 3130 may take the form of any of the embodiments of the coupling components 3116 discussed above, and the electronics packages 3126 and 3132 may take the form of any of the embodiments of the electronics package 3120 discussed above.

Figure 32:
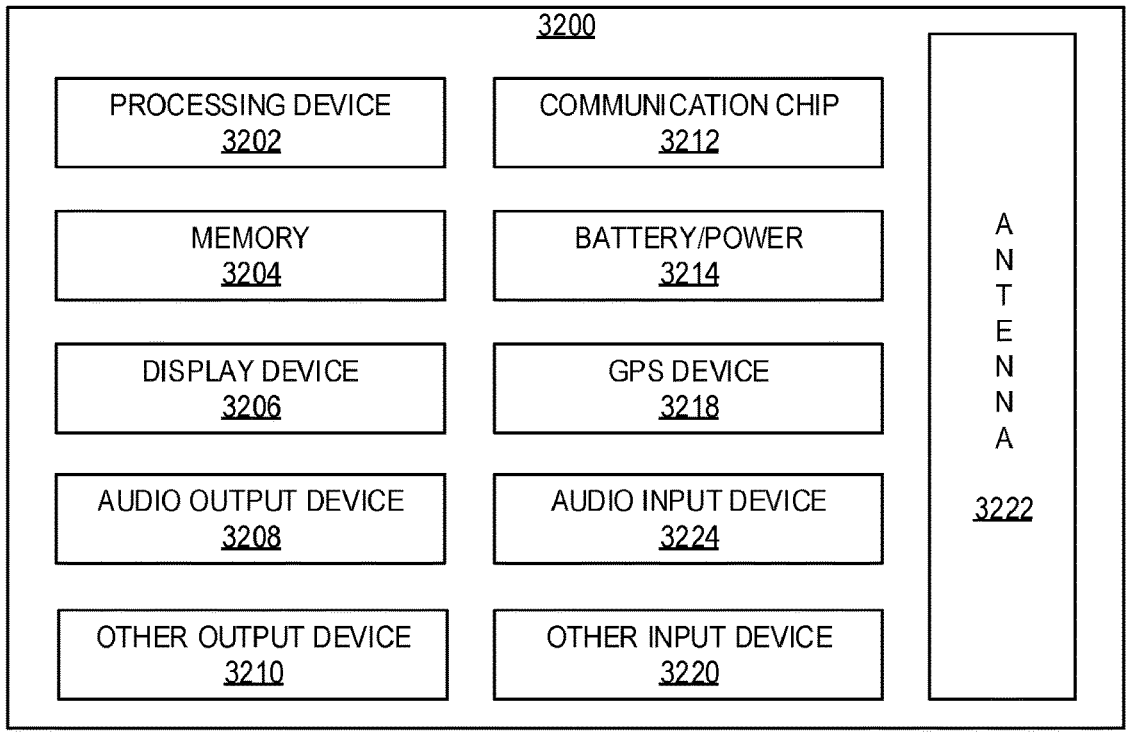
FIG. 32 is a block diagram of an example computing device that may include any of the embodiments of the IC structures disclosed herein.

FIG. 32 is a block diagram of an example computing device 3200 that may include one or more of any of the embodiments of the IC structures disclosed herein. A number of components are illustrated in FIG. 32 as included in the computing device 3200, but any one or more of these components may be omitted or duplicated, as suitable for the application. In some embodiments, some or all of the components included in the computing device 3200 may be attached to one or more motherboards. In some embodiments, some or all of these components are fabricated onto a single system-on-a-chip (SoC) die.

Additionally, in various embodiments, the computing device 3200 may not include one or more of the components illustrated in FIG. 32, but the computing device 3200 may include interface circuitry for coupling to the one or more components. For example, the computing device 3200 may not include a display device 3206, but may include display device interface circuitry (e.g., a connector and driver circuitry) to which a display device 3206 may be coupled. In another set of examples, the computing device 3200 may not include an audio input device 3224 or an audio output device 3208, but may include audio input or output device interface circuitry (e.g., connectors and supporting circuitry) to which an audio input device 3224 or audio output device 3208 may be coupled.

The computing device 3200 may include a processing device 3202 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 3202 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 3200 may include a memory 3204, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 3204 may include memory that shares a die with the processing device 3202. This memory may be used as cache memory and may include embedded dynamic random access memory (eDRAM) or spin transfer torque magnetic random-access memory (STT-M RAM).

In some embodiments, the computing device 3200 may include a communication chip 3212 (e.g., one or more communication chips). For example, the communication chip 3212 may be configured for managing wireless communications for the transfer of data to and from the computing device 3200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 3212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 3212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 3212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 3212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 3212 may operate in accordance with other wireless protocols in other embodiments. The computing device 3200 may include an antenna 3222 to facilitate wireless communications and/or to receive other wireless communications (such as AM or FM radio transmissions).

In some embodiments, the communication chip 3212 may manage wired communications, such as electrical, optical, or any other suitable communication protocols (e.g., the Ethernet). As noted above, the communication chip 3212 may include multiple communication chips. For instance, a first communication chip 3212 may be dedicated to shorter-range wireless communications such as Wi-Fi or Bluetooth, and a second communication chip 3212 may be dedicated to longer-range wireless communications such as GPS, EDGE, GPRS, CDMA, WiMAX, LTE, EV-DO, or others. In some embodiments, a first communication chip 3212 may be dedicated to wireless communications, and a second communication chip 3212 may be dedicated to wired communications.

The computing device 3200 may include battery/power circuitry 3214. The battery/power circuitry 3214 may include one or more energy storage devices (e.g., batteries or capacitors) and/or circuitry for coupling components of the computing device 3200 to an energy source separate from the computing device 3200 (e.g., AC line power).

The computing device 3200 may include a display device 3206 (or corresponding interface circuitry, as discussed above). The display device 3206 may include any visual indicators, such as a heads-up display, a computer monitor, a projector, a touchscreen display, a liquid crystal display (LCD), a light-emitting diode display, or a flat panel display, for example.

The computing device 3200 may include an audio output device 3208 (or corresponding interface circuitry, as discussed above). The audio output device 3208 may include any device that generates an audible indicator, such as speakers, headsets, or earbuds, for example.

The computing device 3200 may include an audio input device 3224 (or corresponding interface circuitry, as discussed above). The audio input device 3224 may include any device that generates a signal representative of a sound, such as microphones, microphone arrays, or digital instruments (e.g., instruments having a musical instrument digital interface (MIDI) output).

The computing device 3200 may include a global positioning system (GPS) device 3218 (or corresponding interface circuitry, as discussed above). The GPS device 3218 may be in communication with a satellite-based system and may receive a location of the computing device 3200, as known in the art.

The computing device 3200 may include an other output device 3210 (or corresponding interface circuitry, as discussed above). Examples of the other output device 3210 may include an audio codec, a video codec, a printer, a wired or wireless transmitter for providing information to other devices, or an additional storage device.

The computing device 3200 may include an other input device 3220 (or corresponding interface circuitry, as discussed above). Examples of the other input device 3220 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 3200 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 3200 may be any other electronic device that processes data.

The following examples pertain to further embodiments. The various features of the different embodiments may be variously combined with some features included and others excluded to suit a variety of different applications.

Example 1 is an integrated circuit package, including: a high-density interconnect layer having a first side and a second side; a pillar formed on the first side of the high-density interconnect layer; a via formed on the second side of the high-density interconnect layer; a first die; and a package substrate.

Example 2 may include the subject matter of Example 1, and may further specify that the first die is electrically coupled to the pillar.

Example 3 may include the subject matter of Example 1, and may further specify that the package substrate is electrically coupled to the via.

Example 4 may include the subject matter of any of Examples 1-3, and may further include: a cavity formed on the package substrate.

Example 5 may include the subject matter of Example 4, and may further include: a second die in the cavity formed on the package substrate, wherein the second die is conductively connected to the package substrate.

Example 6 may include the subject matter of Example 5, and may further include: a third die in the cavity formed on the package substrate, wherein the third die is conductively connected to the second die.

Example 7 may include the subject matter of Example 1, and may further specify that the I/O of the high-density interconnect layer is between 100-1000 I/O/mm/layer.

Example 8 may include the subject matter of Example 1, and may further specify that the I/O of the package substrate is between 15-60 I/O/mm/layer.

Example 9 may include the subject matter of Example 1, and may further specify that a plurality of pillars is formed on the first side of the high-density interconnect layer, and that the bump pitch of the pillars is between 10 um-80 um.

Example 10 may include the subject matter of Example 1, and may further specify that the bump pitch on the back side of the package substrate is between 200 um-1000 um.

Example 11 may include the subject matter of Example 1, and may further specify that the pad size on the high-density interconnect layer is between 1 um-24 um.

Example 12 may include the subject matter of Example 1, and may further specify that the pillar on the high-density interconnect layer is a self-aligned pillar.

Example 13 may include the subject matter of Example 1, and may further specify that the via on the high-density interconnect layer is a self-aligned via.

Example 14 is a method of forming an integrated circuit package, the method including: depositing a first metal layer on a carrier; depositing a second metal layer over the first metal layer; forming a high-density interconnect layer over the second metal layer; forming a pillar on the high-density interconnect layer; forming a via on the high-density interconnect layer; forming a package substrate; removing the substrate from the carrier; etching the first and second metal layers to expose the pillar; and finishing the top and bottom surfaces of the package substrate.

Example 15 may include the subject matter of Example 14, and may further include: attaching a die to the active side, wherein the die is electrically coupled to the pillar on the high-density interconnect layer.

Example 16 may include the subject matter of any of Examples 14-15, and may further specify that forming the package substrate further includes: forming a via in the package substrate; planarizing the top surface of the via; depositing an etch stop material on the top surface of the via; continuing the package substrate build up process forming a cavity; and opening the cavity.

Example 17 may include the subject matter of Example 16, and may further include: attaching a first die in the cavity, wherein the first die is conductively connected to the package substrate.

Example 18 may include the subject matter of Example 17, and may further include: attaching a second die in the cavity, wherein the second die is conductively connected to the first die.

Example 19 may include the subject matter of Example 14, and may further specify that forming a high-density interconnect layer further includes: depositing and patterning a first photoresist layer to form openings for conductive lines; and plating metal in the openings to form conductive lines.

Example 20 may include the subject matter of Example 19, and may further specify that the method of forming the pillar on the high-density interconnect layer further includes: depositing and patterning a second photo resist layer over the first photo resist layer and conductive lines to form an opening for the pillar; etching the pillar opening to remove the plated metal conductive line; etching the pillar opening to remove the second metal layer; replating metal in the opening to form the pillar; and removing the second photoresist layer.

Example 21 may include the subject matter of Example 19, and may further specify that the method of forming the via on the high-density interconnect layer further includes: depositing and patterning a second photo resist layer over the first photo resist layer and conductive lines to form an opening for a via; plating metal in the opening to form the via; and removing the second photoresist layer.

Example 22 is a computing device, including: a circuit board; and an integrated circuit package coupled to the circuit board, wherein the integrated circuit package includes: a high-density interconnect layer having a first side and a second side; a pillar formed on the first side of the high-density interconnect layer; a via formed on the second side of the high-density interconnect layer; a first die; and a package substrate.

Example 23 may include the subject matter of Example 22, and may further specify that the first die is electrically coupled to the pillar.

Example 24 may include the subject matter of Example 22, and may further specify that the package substrate is electrically coupled to the via.

Example 25 may include the subject matter of any of Examples 22-24, and may further include: a cavity formed on the package substrate.

Example 26 may include the subject matter of Example 25, and may further include: a second die in the cavity formed on the package substrate, wherein the second die is conductively connected to the package substrate.

Example 27 may include the subject matter of Example 26, and may further include: a third die in the cavity formed on the package substrate, wherein the third die is conductively connected to the second die.

Example 28 may include the subject matter of Example 22, and may further specify that the I/O of the high-density interconnect layer is between 100-1000 I/O/mm/layer.

Example 29 may include the subject matter of Example 22, and may further specify that the I/O of the package substrate is between 15-60 I/O/mm/layer.

Example 30 may include the subject matter of Example 22, and may further specify that a plurality of pillars is formed on the first side of the high-density interconnect layer, and wherein the bump pitch of the pillars is between 10 um-80 um.

Example 31 may include the subject matter of Example 22, and may further specify that the bump pitch on the back side of the package substrate is between 200 um-1000 um.

Example 32 may include the subject matter of Example 22, and may further specify that the pad size on the high-density interconnect layer is between 1 um-24 um.

Example 33 may include the subject matter of Example 22, and may further specify that the pillar on the high-density interconnect layer is a self-aligned pillar.

Example 34 may include the subject matter of Example 22, and may further specify that the via on the high-density interconnect layer is a self-aligned via.

The invention claimed is:

1. An integrated circuit package, comprising:
   a package substrate having a first face and an opposing second face, and wherein the package substrate includes a plurality of layers;
   a high-density interconnect layer having a first side and an opposing second side, wherein the high-density interconnect layer is an individual layer of the plurality of layers at the first face of the package substrate, wherein an input/output (I/O) of the high-density interconnect layer is between 100 and 1000 I/O/mm/layer, and wherein the high-density interconnect layer includes:
      a plurality of pillars formed on the first side of the high-density interconnect layer, wherein a bump pitch of the plurality of pillars is between 10 um and 80 um, and wherein a diameter of an individual pillar of the plurality of pillars is between 2 um and 20 um; and
      a via formed on the second side of the high-density interconnect layer, wherein a next individual layer of the plurality of layers of the package substrate is electrically coupled to the via; and
   a first die, wherein the first die is electrically coupled to an individual pillar of the plurality of pillars on the high-density interconnect layer.

2. The integrated circuit package of claim 1, wherein a diameter of the via is between 2 um and 10 um.

3. The integrated circuit package of claim 1, further comprising:
   a cavity formed on the package substrate.

4. The integrated circuit package of claim 3, further comprising:
   a second die in the cavity formed on the package substrate, wherein the second die is conductively connected to the package substrate.

5. The integrated circuit package of claim 4, further comprising:
   a third die in the cavity formed on the package substrate, wherein the third die is conductively connected to the second die.

6. The integrated circuit package of claim 1, wherein an I/O of an individual layer of the plurality of layers of the package substrate that is not the high-density interconnect layer is between 15 and 60 I/O/mm/layer.

7. The integrated circuit package of claim 1, wherein a bump pitch of the second face of the package substrate is between 200 um and 1000 um.

8. A computing device, comprising:
   a circuit board; and
   an integrated circuit package coupled to the circuit board, wherein the integrated circuit package comprises:
      a package substrate having a first face and an opposing second face and wherein the package substrate includes a plurality of layers;
      a high-density interconnect layer having a first side and an opposing second side, wherein the high-density interconnect layer is an individual layer of the plurality of layers of the package substrate and is at the first face of the package substrate, wherein an input/output (I/O) of the high-density interconnect layer is between 100 and 1000 I/O/mm/layer, and wherein the high-density interconnect layer includes:
         a plurality of pillars formed on the first side of the high-density interconnect layer, wherein a bump pitch of the plurality of pillars is between 10 um and 80 um; and
         a via formed on the second side of the high-density interconnect layer, wherein a next individual layer of the plurality of layers of the package substrate is electrically coupled to the via, wherein a diameter of the via is between 2 um and 10 um; and
      a first die, wherein the first die is electrically coupled to the package substrate via one or more of the plurality of pillars on the high-density interconnect layer.

9. The computing device of claim 8, wherein a diameter of an individual pillar of the plurality of pillars is between 2 um and 20 um.

10. The computing device of claim 8, wherein a bump pitch of the second face of the package substrate is between 200 um and 1000 um.

11. The computing device of claim 8, further comprising:
   a cavity formed on the package substrate.

12. The computing device of claim 11, further comprising:
   a second die in the cavity formed on the package substrate, wherein the second die is conductively connected to the package substrate.

13. The computing device of claim 12, further comprising:
   a third die in the cavity formed on the package substrate, wherein the third die is conductively connected to the second die.

14. An integrated circuit assembly, comprising:
   a package substrate having a first face and an opposing second face, and wherein the package substrate includes a plurality of layers; and
   a high-density interconnect layer having a first side and an opposing second side, wherein the high-density interconnect layer is an individual layer of the plurality of layers of the package substrate at the first face of the package substrate, wherein an input/output (I/O) of the high-density interconnect layer is between 100 and 1000 I/O/mm/layer, and wherein the high-density interconnect layer includes:
      a plurality of pillars formed on the first side of the high-density interconnect layer, wherein a bump pitch of the plurality of pillars is between 10 um and 80 um, and wherein a diameter of an individual pillar of the plurality of pillars is between 2 um and 20 um; and
      a via formed on the second side of the high-density interconnect layer, wherein a next individual layer of the plurality of layers of the package substrate is electrically coupled to the via.

15. The integrated circuit assembly of claim 14, wherein an I/O of an individual layer of the plurality of layers of the package substrate that is not the high-density interconnect layer is between 15 and 60 I/O/mm/layer.

16. The integrated circuit assembly of claim 14, wherein a bump pitch of the second face of the package substrate is between 200 um and 1000 um.

17. The integrated circuit assembly of claim 14, wherein a diameter of the via is between 2 um and 10 um.

18. The integrated circuit assembly of claim 14, wherein the high-density interconnect layer further includes a pad formed on the second side of the high-density interconnect layer and the pad has a pad size between 1 um and 24 um.

* * * * *